United States Patent
Son et al.

(10) Patent No.: US 6,698,503 B2
(45) Date of Patent: Mar. 2, 2004

(54) HEAT TRANSFERRING DEVICE HAVING ADIABATIC UNIT

(75) Inventors: Sang-young Son, Kyungki-do (KR); Mun-cheol Choi, Kyungki-do (KR); Young-ki Hong, Kyungki-do (KR); Hye-jung Cho, Kyungki-do (KR); Byeoung Ju Ha, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 39 days.

(21) Appl. No.: 10/259,877

(22) Filed: Sep. 30, 2002

(65) Prior Publication Data

US 2003/0079865 A1 May 1, 2003

(30) Foreign Application Priority Data

Oct. 29, 2001 (KR) .................................. 2001-66748

(51) Int. Cl.$^7$ ................................................. F28D 15/00
(52) U.S. Cl. .......................... 165/104.26; 165/104.33; 361/700; 257/715; 174/15.2
(58) Field of Search ................. 165/104.33, 104.26, 165/104.21, 185, 80.4; 361/700; 174/15.2; 257/715

(56) References Cited

U.S. PATENT DOCUMENTS

| | | | | |
|---|---|---|---|---|
| 4,949,164 A | * | 8/1990 | Ohashi et al. ............... | 257/715 |
| 5,725,049 A | * | 3/1998 | Swanson et al. ........ | 165/104.26 |
| 6,148,906 A | * | 11/2000 | Li et al. ................. | 165/104.33 |
| 6,164,368 A | * | 12/2000 | Furukawa et al. ..... | 165/104.33 |
| 6,167,948 B1 | * | 1/2001 | Thomas .................. | 165/104.26 |
| 6,443,222 B1 | * | 9/2002 | Yun et al. .............. | 165/104.26 |
| 6,601,643 B2 | * | 8/2003 | Cho et al. .............. | 165/104.26 |

* cited by examiner

Primary Examiner—Terrell McKinnon
(74) Attorney, Agent, or Firm—Burns, Doane, Swecker & Mathis, L.L.P.

(57) ABSTRACT

A heat transferring device having an adiabatic unit is provided. The heat transferring device includes a lower plate including an evaporator which contacts a heating element and allows a liquid refrigerant to absorb heat transferred from the heating element to thus evaporate, a condenser in which gas flowing from the evaporator is condensed, a gas passage through which the gas flowing from the evaporator into condenser, a liquid refrigerant passage through which the liquid refrigerant flows from the condenser into the evaporator and which includes a portion used as a channel region bordering the evaporator, and an adiabatic unit provided between the liquid refrigerant passage and the gas passage so that elements hindering the flow of the liquid refrigerant can be prevented from being introduced from the gas passage into the liquid refrigerant passage; and an upper plate which contacts some members of the lower plate including the adiabatic unit.

42 Claims, 17 Drawing Sheets

HEAT TRANSFERRING DEVICE HAVING ADIABATIC UNIT

Priority is claimed to Patent Application Number 2001-66748 filed in Republic of Korea on Oct. 29, 2001, herein incorporated by reference.

BACKGROUND OF THE INVENTION

1. Field of the Invention

The present invention relates to a heat transferring device, and more particularly, to a heat transferring device having an adiabatic unit.

2. Description of the Related Art

As the ongoing development of electronic technology has led to the modularization, miniaturization and increase of the output power of electronic equipment, the amount of heat radiated from electronic equipment per unit area, that is, a ratio of heat radiation per unit area in the electronic equipment, has increased. Accordingly, performance of appropriately processing and controlling heat radiated from such electronic equipment has become an important factor which should be considered during design of electronic equipment.

The temperature of electronic equipment can be controlled using heat conduction, natural convection/radiation of the air, forced convection, cooling by fluid, immersion cooling, or a heat pipe.

In addition, the temperature of electronic equipment can be controlled using capillary pumped loop flow (CPLF) by surface tension which was proposed by Stenger in the NASA Lewis center for the first time. Particularly, since it was proved by Tuckerman and Pease that a micro channel cooling method can be used for cooling high-heat radiation electronic equipment, it is possible to control the entire temperature of electronic equipment by selectively cooling only a member such as a central processing unit (CPU) having a higher ratio of heat radiation per unit area than other members constituting the electronic equipment.

FIG. 1 is a schematic diagram of a heat transferring device using a capillary tube proposed by Stenger. Referring to FIG. 1, a pipe 1 having a passage of a predetermined size through which a working fluid 23 flows forms a loop. An evaporator 2 is provided on the passage of the pipe 1. The evaporator 2 is composed of a case 21 to which heat is transmitted from the outside of the evaporator 2 and a porous body 22 provided within the case 21. The porous body 22 has micro pores inducing a capillary action so that the working fluid 23 can be sucked into the pores due to the capillary action. Then, the working fluid 23 within the pores is evaporated by heat absorbed from the outside. Vapor generated by phase change of the working fluid 23 is discharged through an outlet facing an inlet through the working fluid 23 flows into the evaporator 2 and flows through the pipe 1. As the vapor flows through the pipe 1, the vapor is gradually cooled and finally turned into a liquid. The liquid, that is, the working fluid 23, flows toward the evaporator 2. In such a structure, since vapor is turned into a liquid while it flows through the pipe 1 having a predetermined length, bubbles are formed here and there within the pipe 1.

Such a conventional heat transferring device cannot be manufactured to have a large size and is not suitable to compact electronic devices. In addition, bubbles scattered within a pipe and an uncondensed working fluid between bubbles act as a resistance against the flow of the entire working fluid.

SUMMARY OF THE INVENTION

To solve the above-described problems, it is an object of the present invention to provide a heat transferring device in which the flow of a liquid refrigerant can be prevent from being stopped while a compact electronic device is cooled, the flow of a liquid refrigerant can be automatically and quickly restarted when the flow of the liquid refrigerant is stopped for a moment, and the liquid refrigerant can be always supplied to an evaporator, so that the initial operation can be stabilized.

To achieve the above object of the present invention, there is provided a heat transferring device including a lower plate including an evaporator which contacts a heating element and allows a liquid refrigerant to absorb heat transferred from the heating element to thus evaporate, a condenser in which gas flowing from the evaporator is condensed, a gas passage through which the gas flowing from the evaporator into condenser, a liquid refrigerant passage through which the liquid refrigerant flows from the condenser into the evaporator and which includes a portion used as a channel region bordering the evaporator, and an adiabatic unit provided between the liquid refrigerant passage and the gas passage so that elements hindering the flow of the liquid refrigerant can be prevented from being introduced from the gas passage into the liquid refrigerant passage; and an upper plate which contacts some members of the lower plate including the adiabatic unit.

The adiabatic unit includes a first adiabatic unit and a second adiabatic unit which are symmetric or is a single unit parallel to the frame of the lower plate and includes a bended part.

Micro patterns are formed in the condenser, the liquid refrigerant passage, the channel region, and the evaporator such that capillary attraction for the liquid refrigerant gradually increases from the condenser toward the evaporator sequentially through the liquid refrigerant passage and the channel region.

A chamber is provided between the upper plate and the micro patterns formed in the liquid refrigerant passage which does not contact the upper plate by removing the inner side of the upper plate to a predetermined depth.

Regions of the upper plate corresponding to the evaporator, the gas passage, and the condenser are recessed a predetermined depth.

The condenser extends beyond the upper end of the adiabatic unit and borders the liquid refrigerant passage provided between the adiabatic unit and the frame of the lower plate adjacent to and the adiabatic unit.

When the liquid refrigerant passage is divided into two regions by the channel region, the adiabatic unit includes a first adiabatic unit which isolates the gas passage from the first region of the liquid refrigerant passage provided between the condenser and the channel region; and a second adiabatic unit which is formed to be perpendicular to the first adiabatic unit and isolates the evaporator and the gas passage from the remaining second region of the liquid refrigerant passage.

Each of the first and second adiabatic units is a structure including a gap or is a barrier formed of an insulating material, or one of the first and second adiabatic units is a structure including a gap and the other is a barrier formed of an insulating material.

The adiabatic unit is a structure including a gap or a barrier formed of an insulating material.

According to the present invention, a liquid refrigerant is prevented from evaporating while it is flowing from a condenser to an evaporator. The flow of the liquid refrigerant is prevented from being stopped due to bubbles or uncondensed gas. Moreover, the liquid refrigerant spontaneously flows from the condenser through a liquid refrigerant passage into the evaporator. Even if the flow of the liquid refrigerant is stopped for a short moment due to, for example, dry-out, the flow of the liquid refrigerant spontaneously resumes due to the slope of capillary attraction among the condenser, the liquid refrigerant passage, and the evaporator. The slope of capillary attraction allows the liquid refrigerant to flow into the evaporator before the operation of a heat transferring device so that the heat transferring device can operate reliably.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Hereinafter, preferred embodiments of a heat transferring device according to the present invention will be described in detail with reference to the attached drawings.

<First Embodiment>

Figure 1:
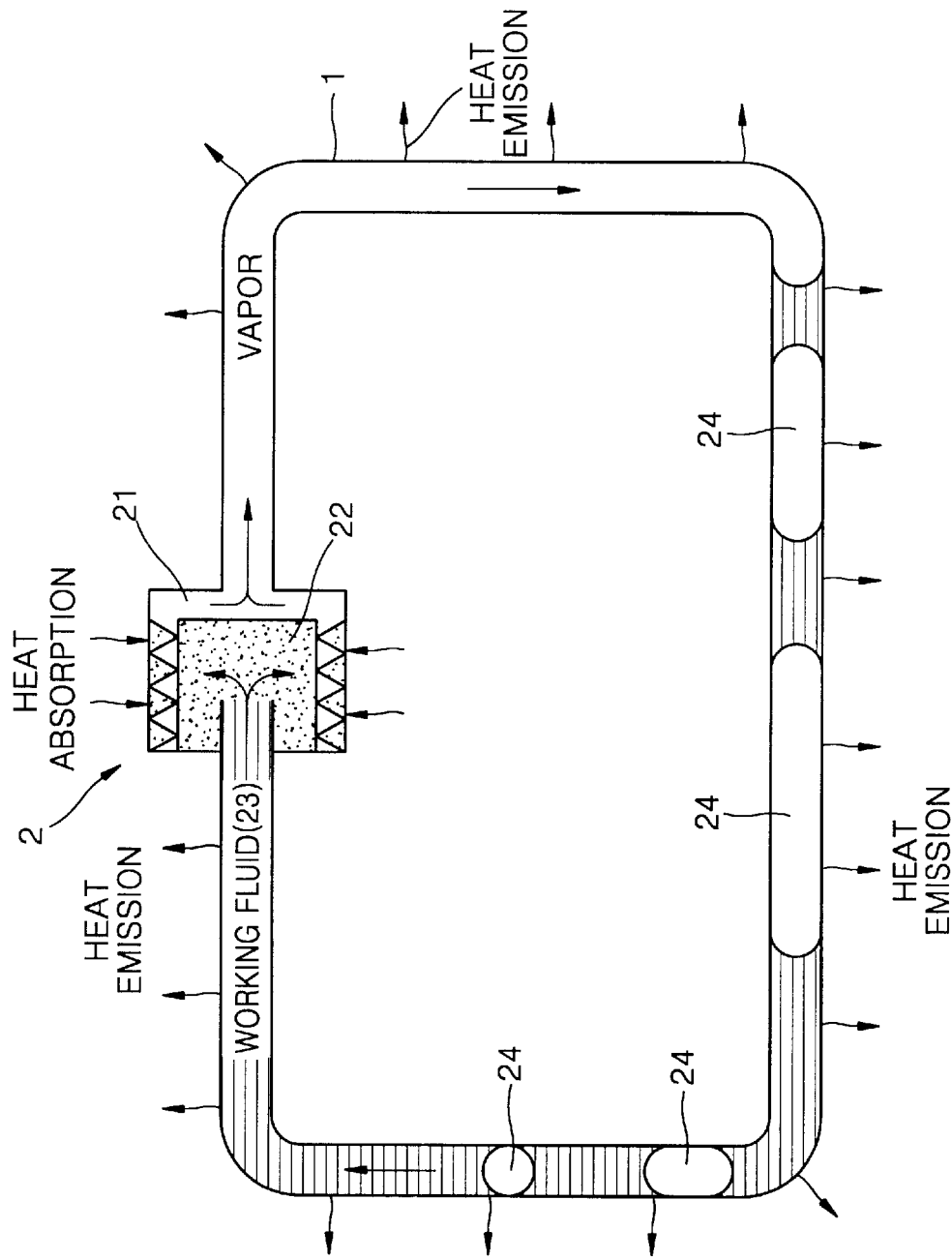
FIG. 1 is a schematic plan view of a conventional heat transferring device.
Figure 2:
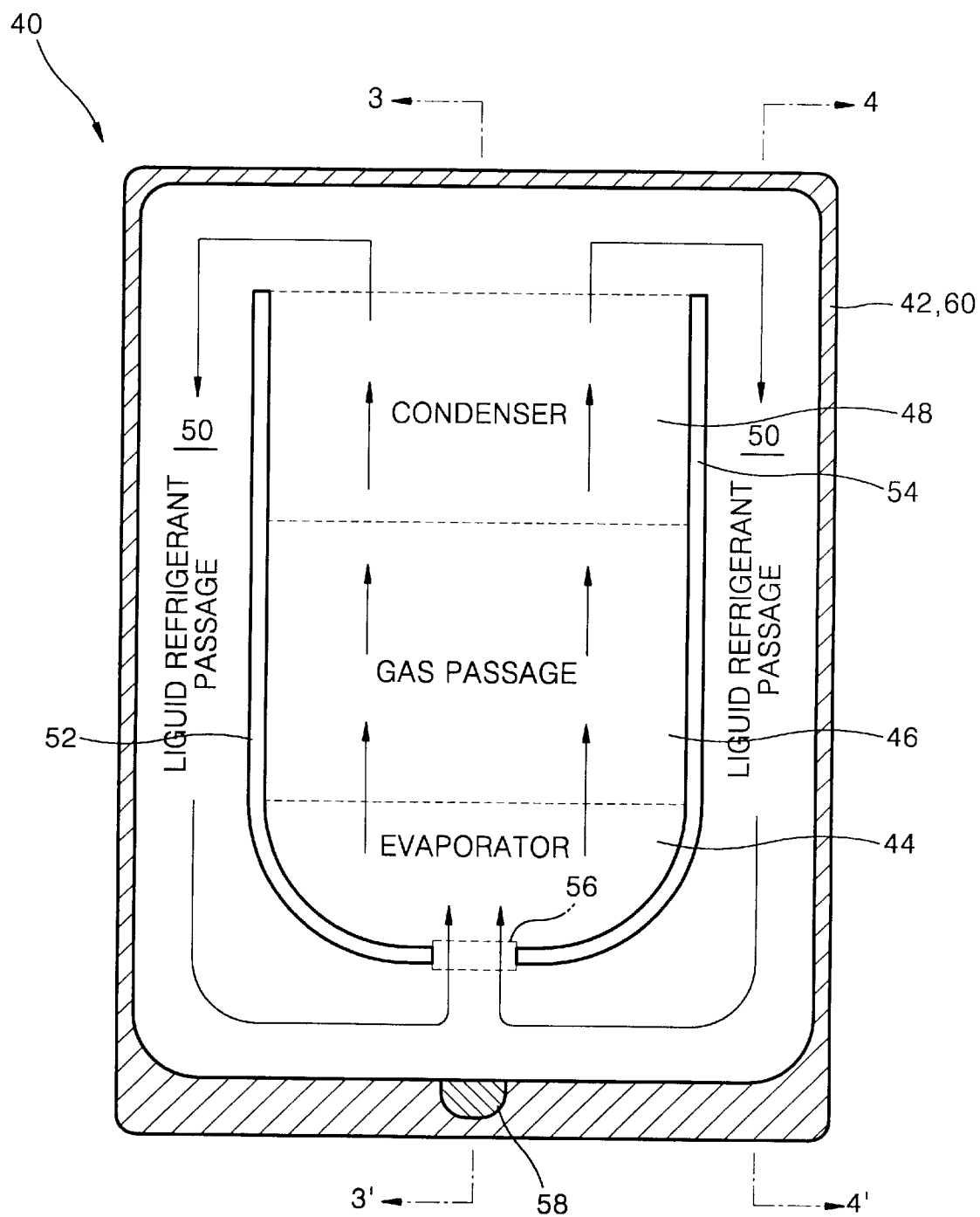
FIG. 2 is a plan view of a heat transferring device with a glass cover which is manufactured by micro electro mechanical system (MEMS) technology according to a first embodiment of the present invention.

Referring to FIG. 2, reference numeral 40 denotes a heat transferring device, reference numeral 42 denotes a lower plate of the heat transferring device 40. There is provided an upper plate, that is, a cover, exactly matching with the lower plate 42 although the upper plate is not shown because it is formed of a transparent material such as a glass plate.

The heat transferring device 40 includes an evaporator 44 as a region in which a refrigerant absorbing heat transferred from a radiating member (not shown) such as a central processing unit (CPU) within electronic equipment evaporates and a condenser 48 in which gas transferred from the evaporator 44 is condensed into a liquid. The condenser 48 is connected to the evaporator 44 by a gas passage 46 through which gas is transferred from the evaporator 44 to the condenser 48. In addition, a liquid refrigerant passage 50 is provided between the condenser 48 and the evaporator 44 so that a liquid refrigerant into which gas is condensed in the condenser 48 can be introduced toward the evaporator 44 via the liquid refrigerant passage 50. A channel region 56 is provided at the border between the liquid refrigerant passage 50 and the evaporator 44 so that the liquid refrigerant can flow into the evaporator 44 through the channel region 56.

The liquid refrigerant passage 50 is provided around the evaporator 44, the gas passage 46, and the condenser 48. Adiabatic units 52 and 54 are provided between the liquid refrigerant passage 50 and a central part including the evaporator 44, the gas passage 46, and the condenser 48. The adiabatic units 52 and 54 are provided for preventing heat from being transferred from one region to another region. More specifically, the adiabatic units 52 and 54 are provided for preventing heat from being transferred from the evaporator 44 and the gas passage 46 to a liquid refrigerant flowing through the liquid refrigerant passage 50 toward the evaporator 44 or at least for reducing the quantity of transferred heat below a minimum quantity of heat at which the liquid refrigerant can evaporate. The adiabatic units 52 and 54 are symmetric with respect to the evaporator 44 and the gas passage 46 and are connected to both ends, respectively, of the channel region 56. Accordingly, the channel region 56 is a sole entrance through which a liquid refrigerant can flow into the evaporator 44 from the liquid refrigerant passage 50. The adiabatic unit 52 on the left of the channel region 56 is referred to as a first adiabatic unit, and the adiabatic unit 54 on the right of the channel region 56 is referred to as a second adiabatic unit. The first and second adiabatic units 52 and 54 are symmetrically disposed and preferably have the same shape.

Due to the adiabatic units 52 and 54, the liquid refrigerant is prevented from evaporating at least while it flows from the condenser 48 into the evaporator 44 through the liquid refrigerant passage 50. The adiabatic units 52 and 54 extend to predetermined portions of the condenser 48. The liquid refrigerant passage 50 is formed such that the liquid refrigerant can flow around the adiabatic units 52 extending to the condenser 48 and into the channel region 56. In other words, the liquid refrigerant passage 50 is formed in a U-shape between the sequence of the evaporator 44, the gas passage 46, and the condenser 48 and the frame of the lower plate 42. Accordingly, the adiabatic units 52 and 54 form a U-shape along the liquid refrigerant passage 50.

Since the adiabatic units 52 and 54, which prevent the liquid refrigerant from evaporating due to heat transferred from the evaporator 44 and/or the gas passage 46 while the liquid refrigerant is supplied from the condenser 48 to the evaporator, and simultaneously, prevent vapor from flowing into the liquid refrigerant passage 50, are provided, the flow of the liquid refrigerant can be prevented from being stopped due to dry-out. In addition, micro patterns are formed on a path from the condenser 48 through the liquid refrigerant passage 50 to the evaporator 44 such that capillary attraction for the liquid refrigerant gradually increases toward the evaporator 44. This will be described later. Accordingly, even if the flow of the liquid refrigerant from the condenser 48 to the evaporator 44 is sopped due to dry-out occurring in a portion of the liquid refrigerant passage 50 during the operation of the heat transferring device 40, the flow of the liquid refrigerant is spontaneously resumes due to capillary attraction toward the dry-out region. As described above, since there is a slope in the capillary attraction starting from the condenser 48 through the liquid refrigerant passage 50 to the evaporator and capillary attraction is strongest in the evaporator 44, the liquid refrigerant can be stably supplied to the evaporator 44 during the initial operation of the heat transferring device 40. A refrigerant inlet 58 is provided at the frame of the lower plate 42 facing the channel region 56.

Figure 3:
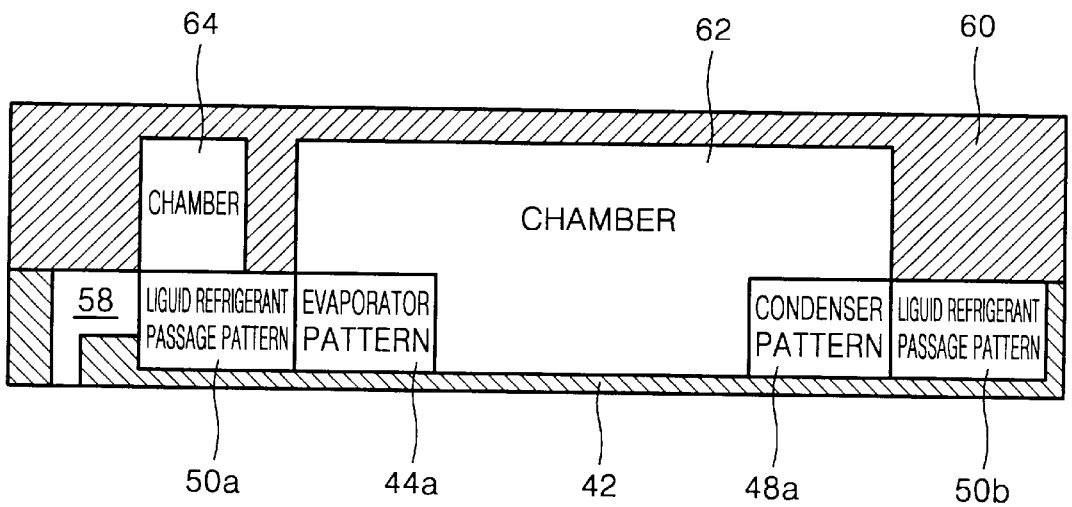
FIG. 3 is a sectional view of the heat transferring device of FIG. 2, taken along the line 3–3'.

FIG. 3 is a sectional view of the heat transferring device 40 taken along the line 3–3' crossing the centers of the channel region 56, the evaporator 44, the gas passage 46, and the condenser 48. Referring to FIGS. 2 and 3, an evaporator pattern 44a is formed on the lower plate 42 corresponding to the evaporator 44 to induce capillary attraction from the liquid refrigerant passage 50 toward the evaporator 44 so that a liquid refrigerant can flow into the evaporator 44 from the liquid refrigerant passage 50. The evaporator pattern 44a is represented by a block for convenience sake. The detailed shape of the evaporator pattern 44 will be described later. A liquid refrigerant passage pattern 50a is formed on the lower plate 42 corresponding to the liquid refrigerant passage 44. A portion of the liquid refrigerant passage pattern 50a near the border between the liquid refrigerant passage pattern 50a and the evaporator pattern 44a contacts the upper plate 60. The contact portion corresponds to the channel region 56. A condenser pattern 48a is formed on the lower plate 42 corresponding to the condenser 48. A liquid refrigerant passage pattern 50b is formed on the lower plate 42 between the condenser pattern 48a and the close frame of the lower plate 42. The liquid refrigerant passage pattern 50a disposed in the liquid refrigerant passage 50 between the evaporator pattern 44a and the close frame of the lower plate 42 and the liquid refrigerant passage pattern 50b disposed in the liquid refrigerant passage 50 between the condenser pattern 48a and the close frame of the lower plate 42 all serve to allow the liquid refrigerant to flow from the condenser 48 to the evaporator 44 but preferably have different shapes and densities. More specifically, it is preferable that the shape of the liquid refrigerant passage pattern 50b disposed in the liquid refrigerant passage 50 between the condenser pattern 48a and the close frame of the lower plate 42 is the same as that of the condenser pattern 48a, and it is preferable that the density of the liquid refrigerant passage pattern 50b is greater than that of the condenser pattern 48a so that capillary attraction acts on the liquid refrigerant to make the liquid refrigerant flow from the condenser 48 to the liquid refrigerant passage 50. In other words, the liquid refrigerant passage pattern 50b is formed such that capillary attraction in the condenser 48 is smaller than in the liquid refrigerant passage 50 close to the condenser 48. Unlike the liquid refrigerant passage pattern 50b close to the condenser pattern 48a, the liquid refrigerant passage pattern 50a disposed in the liquid refrigerant passage 50 between the evaporator pattern 44a and the close frame of the lower plate 42 is formed such that capillary attraction in the evaporator 44 is greater than in the liquid refrigerant passage 50 close to the evaporator 44. However, a portion of the liquid refrigerant passage pattern 50a close to the evaporator 44 is formed to have greater capillary attraction than the condenser 48 and any other liquid refrigerant pattern including the liquid refrigerant passage pattern 50b formed in the remaining portion of the liquid refrigerant passage 50.

The frame of the lower plate 42 is hermetically sealed to the upper plate 60. However the inner portion of the lower plate 42 does not contact the upper plate 60 except a portion corresponding to the channel region 56 of the liquid refrigerant passage pattern 50a and the liquid refrigerant passage pattern 50b close to the condenser pattern 48a. In other words, a portion of the liquid refrigerant passage pattern 50a formed between the channel region 56 and the frame of the lower plate 42 at which the refrigerant inlet 58 is formed, the evaporator pattern 44a, the condenser pattern 48a, and the gas passage 46 do not contact the upper plate 60. A chamber 62 is formed between a region of the lower plate 42 which does not contact the upper plate 60, that is, a region used as the gas passage 46, and the upper plate 60 by partially removing the inner side of the upper plate 60 to a predetermined thickness. The chamber 62 extends over the evaporator pattern 44a and the condenser pattern 48a. In such a structure, the liquid refrigerant flows into the evaporator 44 due to the capillary attraction of the evaporator pattern 44a, absorbs heat transferred from a heating element, and evaporates to thus generate, gas. The gas flows to the condenser 48 through the chamber 62. Another chamber 64 is formed in a region above the liquid refrigerant passage pattern 59a which does contact the upper plate 60. Like the chamber 62, the chamber 64 is formed by partially removing the inner side of the upper plate 60 to a predetermined thickness. The chambers 62 and 64 are simultaneously formed by the same process. The chamber 64 can be used as a space for collecting bubbles or uncondensed gas in the liquid refrigerant flowing into the evaporator 44 through the liquid refrigerant passage 50. Since bubbles or uncondensed gas contained in the liquid refrigerant can be collected using the chamber 64 provided above the liquid refrigerant passage 50, the flow of the liquid refrigerant can be prevented from being stopped due to the bubbles or uncondensed gas.

Figure 4:
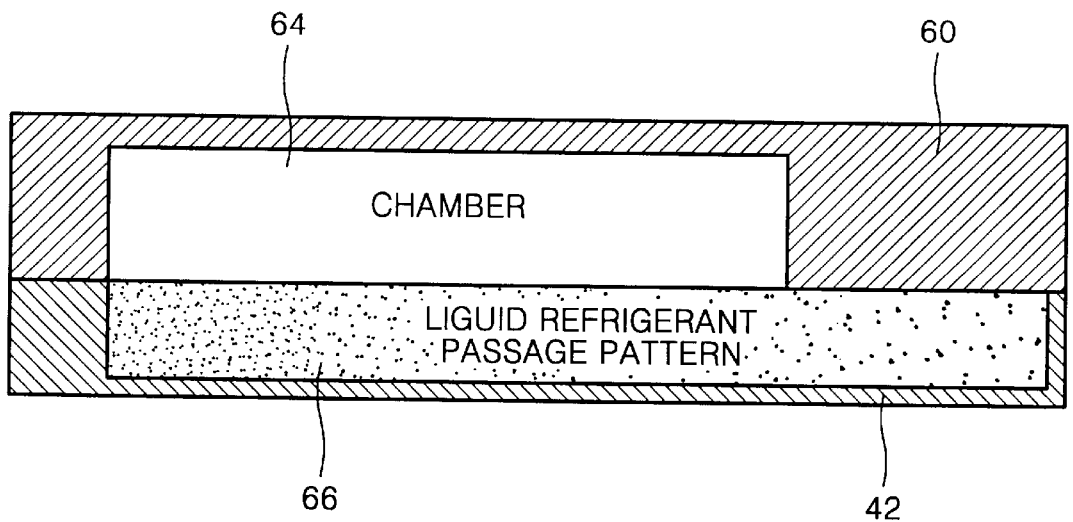
FIG. 4 is a sectional view of the heat transferring device of FIG. 2, taken along the line 4–4'.

FIG. 4 is a sectional view of the heat transferring device 40 taken along the line 4–4' vertically crossing the centers of the liquid refrigerant passage 50 between the second adiabatic unit 54 and the frame of the lower plate 42 close to the second adiabatic unit 54. Referring to FIGS. 2 and 4, a pattern (hereinafter, referred to as a liquid refrigerant passage pattern) 66 is formed in the liquid refrigerant passage 50 between the second adiabatic unit 54 and the frame of the lower plate 42 such that capillary attraction gradually increases from the condenser 48 toward the evaporator 44 to supply the liquid refrigerant to the evaporator 44. Dots within the block symbolically representing the liquid refrigerant passage pattern 66 show that the density of a pattern formed on the liquid refrigerant passage 50 provided between the condenser 48 and the evaporator 44 gradually increases toward the evaporator 44. As the density of the pattern increases, capillary attraction also increases. Accordingly, due to the liquid refrigerant passage pattern 66 formed in the liquid refrigerant passage 50 between the condenser 48 and the evaporator 44, capillary attraction for the liquid refrigerant gradually increases from the condenser 48 toward the evaporator 44.

A portion of the liquid refrigerant pattern 66 close to the condenser 48 contacts the upper plate 60, but the chamber 64 is formed between the other portion of the liquid refrigerant pattern 66 and the upper plate 60. Although not shown in FIG. 4, it is preferable that the adiabatic units 52 and 54 are hermetically sealed to the upper plate 60, so the region of the chamber 64 is defined by the contact between the upper plate 60 and the adiabatic units 52 and 54, the frame of the lower plate 42, and the liquid refrigerant passage pattern 66 near the condenser 48. The region of the chamber 62 used as the gas passage 46 is defined by the contact between the upper plate 60 and the adiabatic units 52 and 54, a pattern formed in the channel region 56, and the liquid refrigerant passage pattern 50b.

Figure 5:
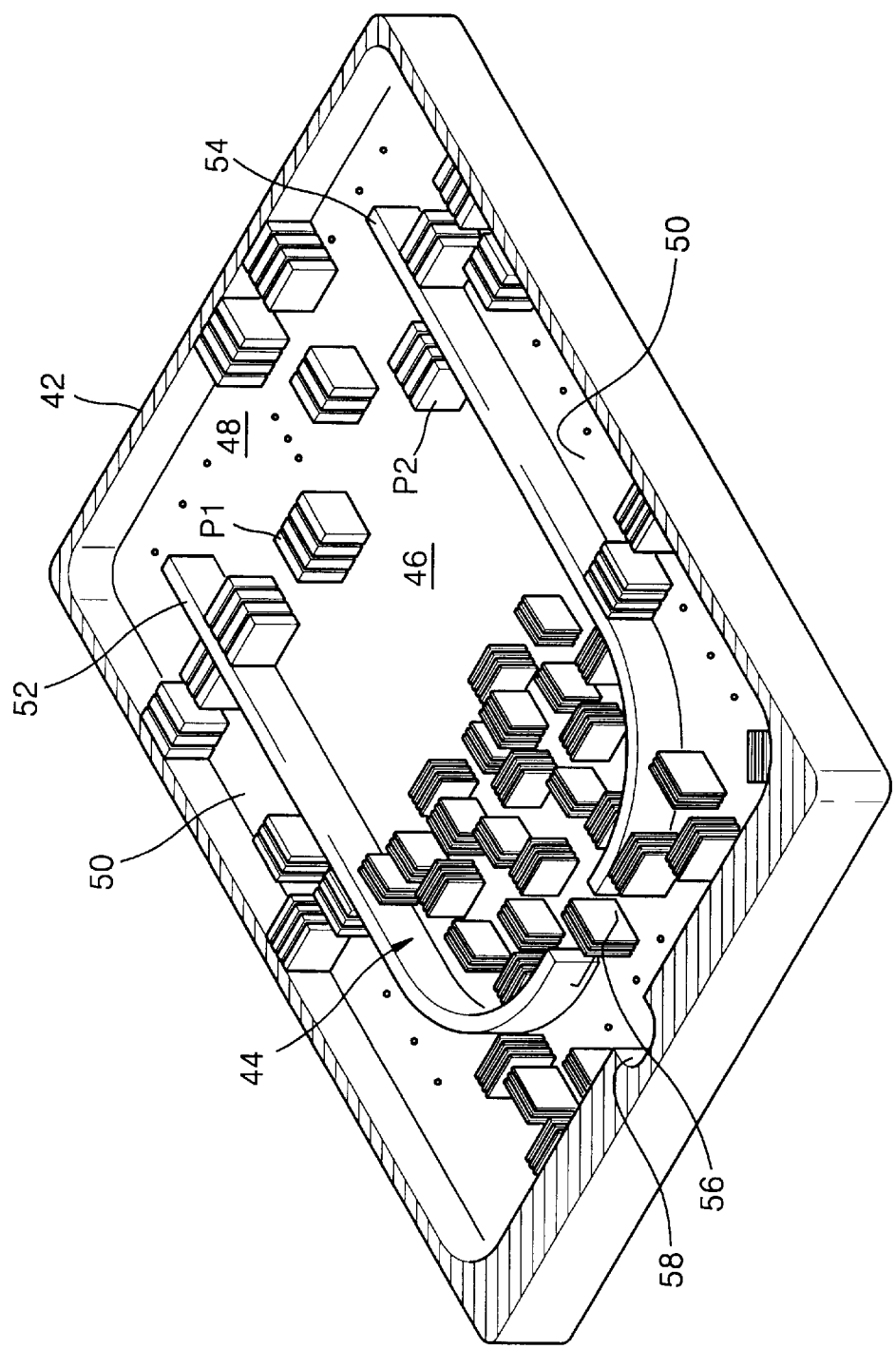
FIG. 5 is a perspective view of a lower plate of a heat transferring device according to the first embodiment of the present invention.

FIG. 5 is a perspective view of the lower plate 42 having the evaporator pattern 44a, the liquid refrigerant passage patterns 50a, 50b, and 66, the condenser pattern 48a, the adiabatic units 52 and 54, and the refrigerant inlet 58. Referring to FIG. 5, the tops of the adiabatic units 52 and 54 are level with the top of the frame of the lower plate 42. Accordingly, the adiabatic units 52 and 54 closely contact the upper plate 60, so the evaporator 44 and the gas passage 46 can be completely isolated from the liquid refrigerant passage 50. In addition, patterns having the same height as that of the adiabatic units 52 and 54 and having the same shape are formed on the lower plate 42 corresponding to the condenser 48, the liquid refrigerant passage 50, and the evaporator 44. The density of patterns gradually increases from the condenser 48 toward the evaporator 44. Accordingly, capillary attraction increases from the condenser 48 toward the evaporator 44.

More specifically, a plurality of pattern groups are formed in the condenser 48. Each of the pattern groups is composed of a plurality of patterns and disposed to be perpendicular to an adjacent pattern group. In one pattern group, a plurality of rectangular parallelepipeds P1 are arranged in line at predetermined intervals, and in another adjacent pattern group, a plurality of rectangular parallelepipeds P2 are arranged in line at predetermined intervals in a direction perpendicular to the rectangular parallelepipeds P1. The patterns constituting each pattern group can have any other geometric shape which can direct the flow of a liquid refrigerant.

Figure 6:
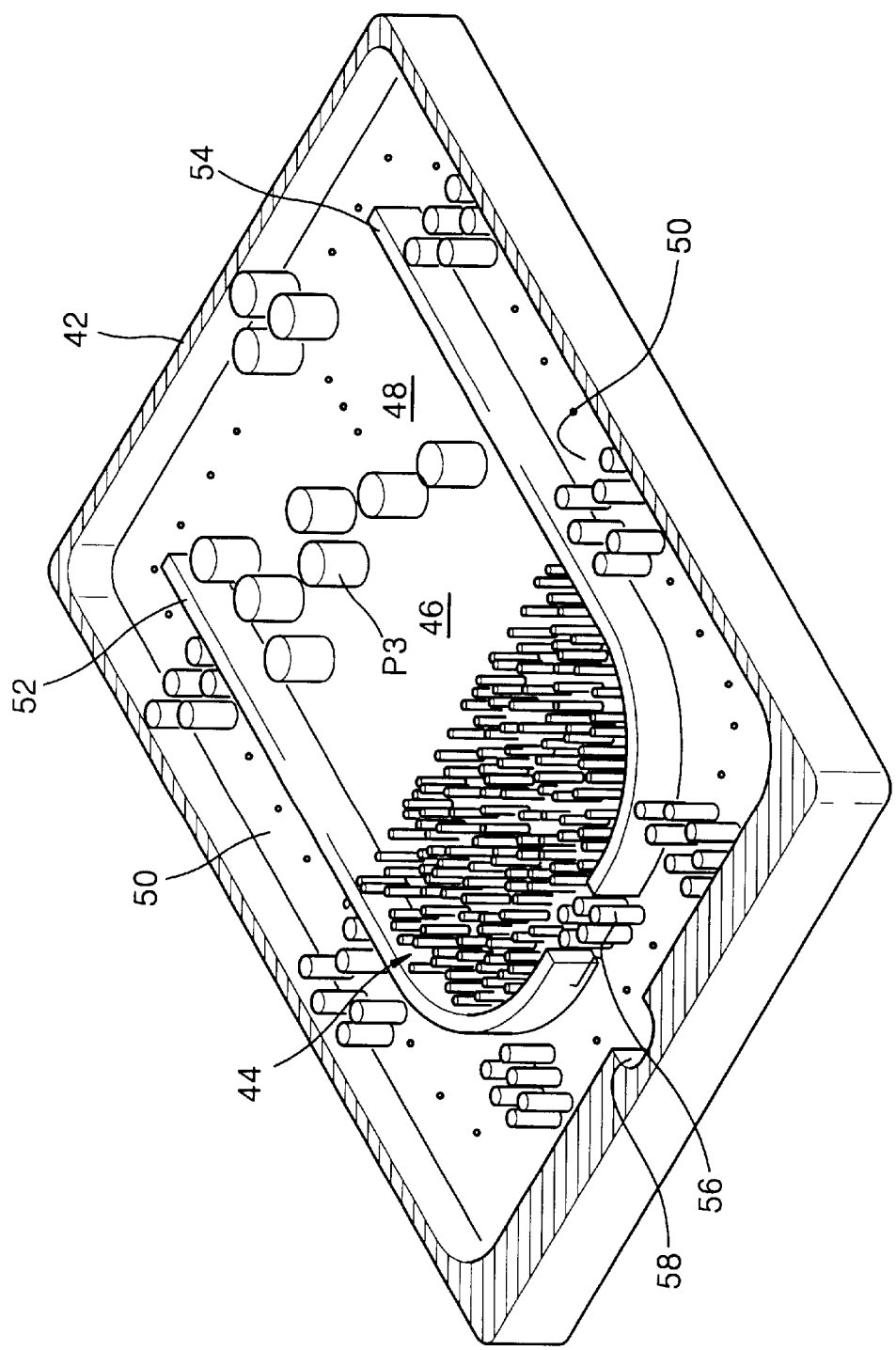
FIG. 6 is a perspective view of the lower plate of FIG. 5 in which patterns are replaced with cylinders.

For example, all of the patterns formed in the condenser 48, the liquid refrigerant passage 50, and the evaporator 44 can be replaced with cylinders P3, as shown in FIG. 6. Here, it is preferable that the density of the cylinders P3 gradually increases from the condenser 48 through the liquid refrigerant passage 50 to the evaporator 44.

As the density of patterns increases toward the evaporator 44, the space between the patterns becomes narrower toward the evaporator 44. As a result, capillary attraction increases and reaches a maximum at the evaporator 44.

Figure 7:
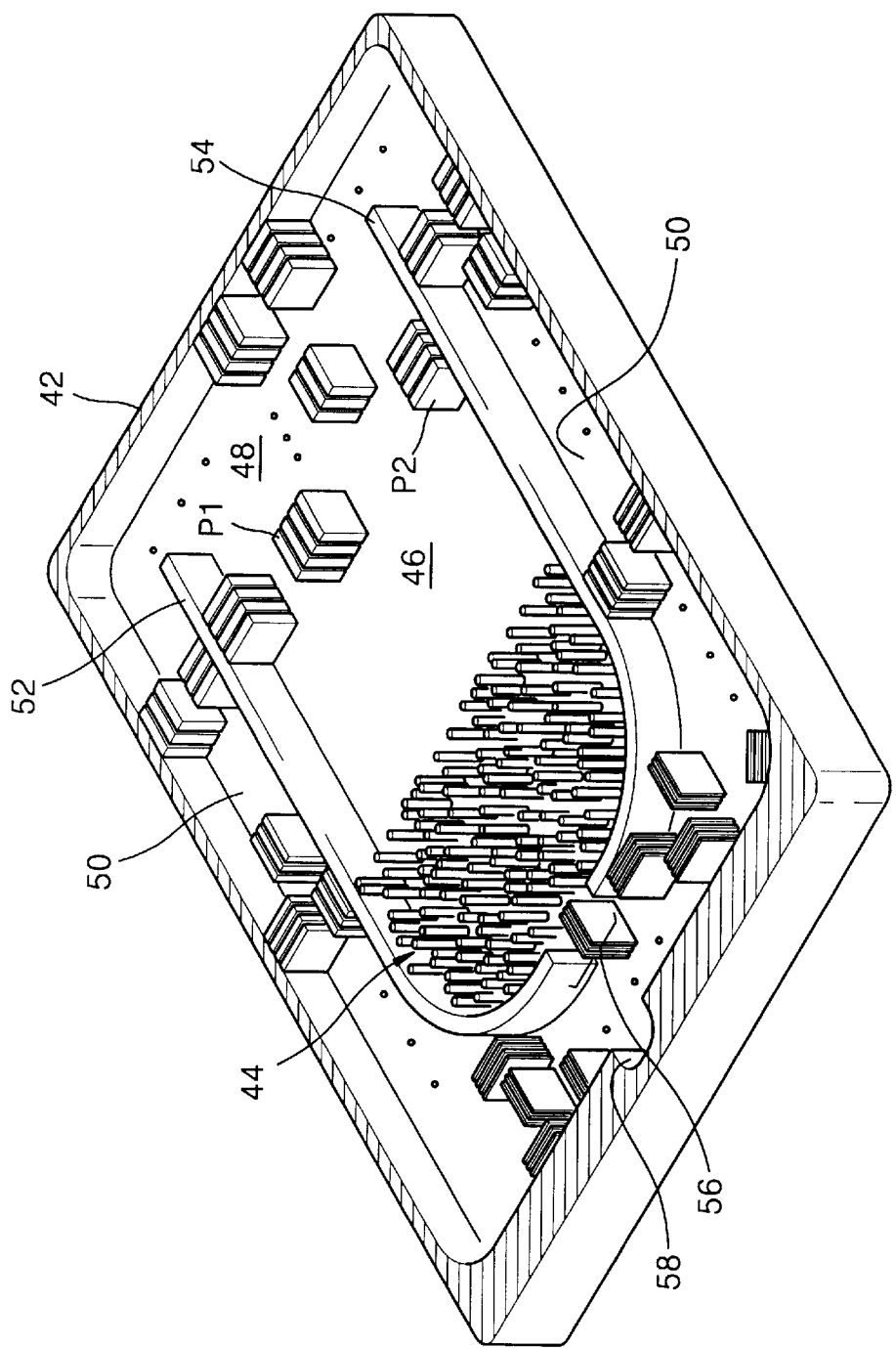
FIG. 7 is a perspective view of the lower plate of FIG. 5 in which an evaporator pattern is replaced with a group of cylinders.

Instead of replacing all of the patterns on the lower plate 42 with patterns of a different shape, as shown in FIG. 6, only some of the patterns can be replaced with patterns of a different shape, as shown in FIG. 7.

Referring to FIG. 7, patterns formed in the condenser 48, the liquid refrigerant passage 50, and the channel region 56 are all rectangular parallelepipeds, but patterns formed in the evaporator 44 are cylinders.

As describe above, in the first embodiment, all of the rectangular parallelepiped patterns formed on the lower plate 42 can be replaced with patterns of a different shape, or only patterns formed in at least one particular region can be replaced with patterns of a different shape, only if the patterns can direct the flow of a liquid refrigerant.

Figure 8:
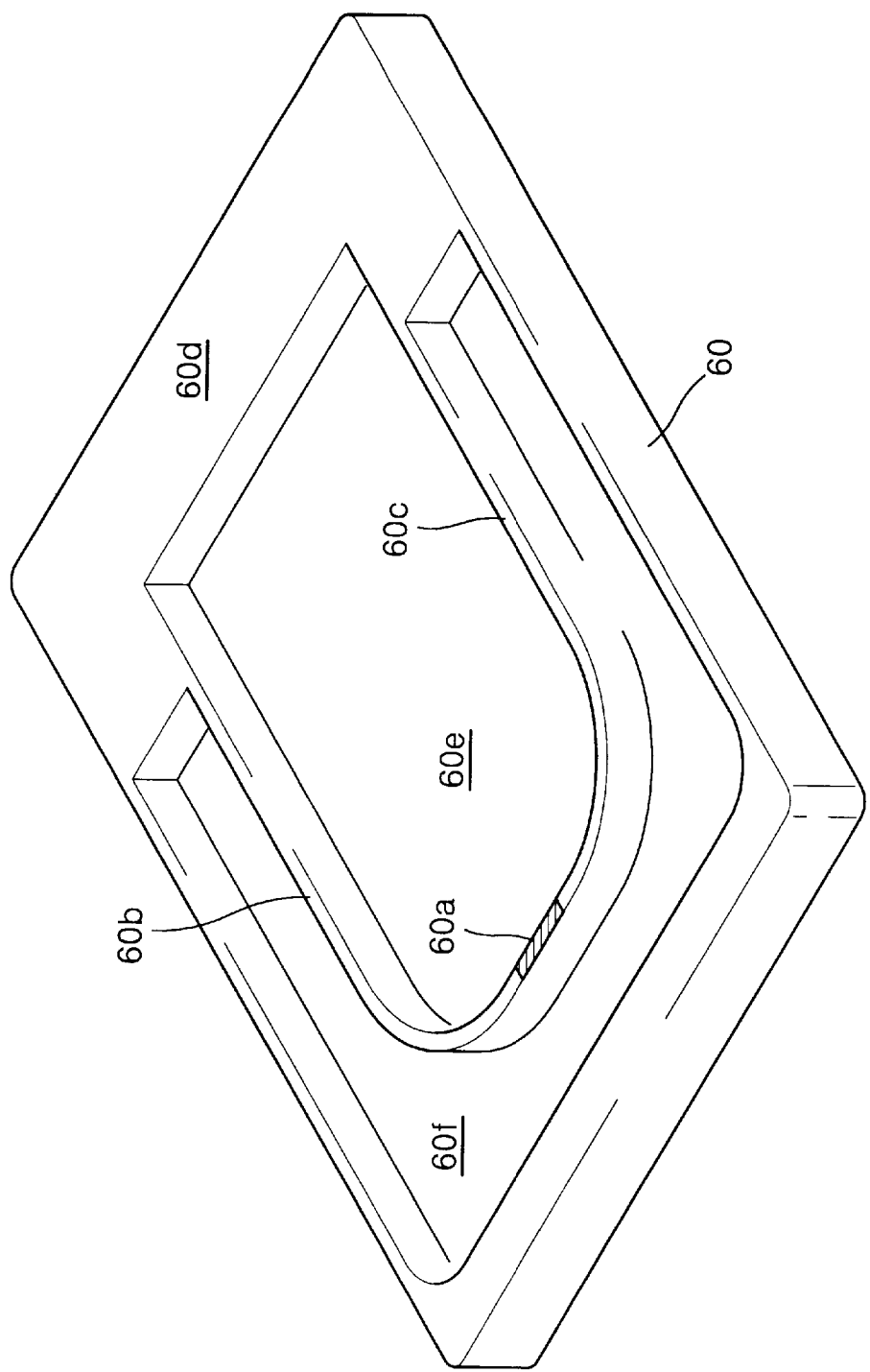
FIG. 8 is a perspective view of an upper plate matching with the lower plate shown in FIG. 5.

FIG. 8 is a perspective view of the upper plate 60 and shows the inside of the upper plate 60 contacting the lower plate 42. Reference numeral 60a denotes a portion of the upper plate 60 contacting the channel region 56 of the lower plate 42. Reference numerals 60b and 60c denote a portion of the upper plate 60 contacting the second adiabatic unit 54 and a portion of the upper plate 60 contacting the first adiabatic unit 52, respectively. Reference numeral 60d denotes a portion of the upper plate 60 contacting the liquid refrigerant passage 50 between the condenser 48 and the frame of the lower plate 42 close to the condenser 48 and the liquid refrigerant passage 50 which is between the adiabatic units 52 and 54 and the close frame of the lower plate 42 and is near to the condenser 48. Reference numeral 60e denotes a space used as a chamber (62 of FIG. 3) formed between the gas passage 46 of the lower plate 42 and the upper plate 60. Reference numeral 60f denotes a space corresponding to a chamber (64 of FIGS. 3 and 4) provided between the liquid refrigerant passage 50 and the upper plate 60 to collect bubbles or uncondensed gas contained in a liquid refrigerant. Accordingly, the spaces 60e and 60f used as the chambers 62 and 64 are recessed by a predetermined thickness compared to the portions 60a, 60b, 60c, and 60d contacting the lower plate 42.

Figure 9:
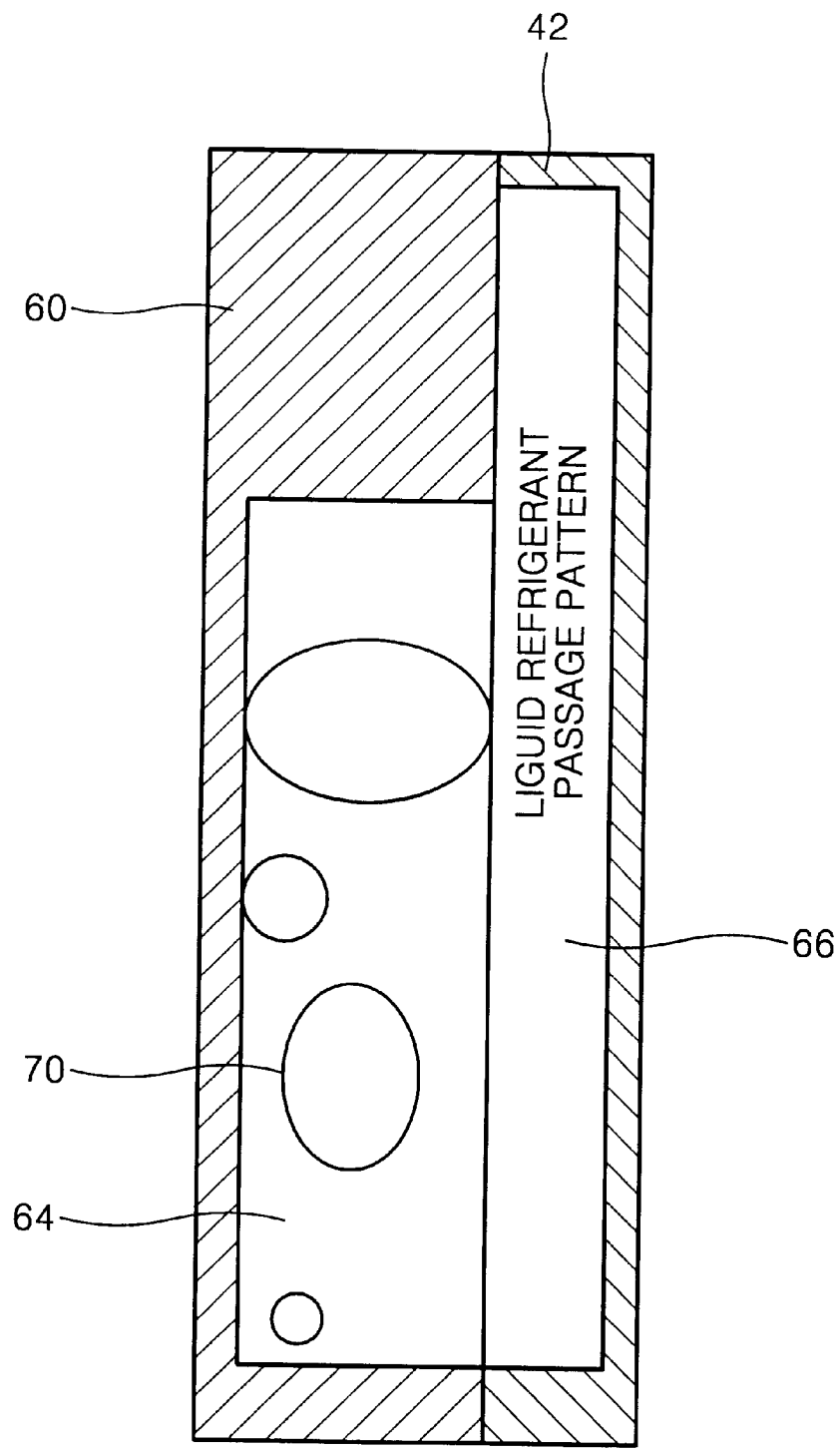
FIG. 9 is a sectional view of a heat transferring device according to the first embodiment of the present invention in which uncondensed gas or bubbles gather in a chamber provided between a liquid refrigerant passage pattern and an upper plate.

FIG. 9 shows a state in which a bubble or uncondensed gas 70 contained in a liquid refrigerant is collected in the chamber 64 provided between the liquid refrigerant passage pattern 66 and the upper plate 60. As shown in FIG. 9, by removing elements such as bubbles and uncondensed gas 70 hindering the flow of a liquid refrigerant from the liquid refrigerant flowing from the condenser 48 to the evaporator 44 using the chamber 64 provided between the liquid refrigerant passage pattern 66 and upper plate 60, the liquid refrigerant can be smoothly supplied to the evaporator 44.

Figure 10:
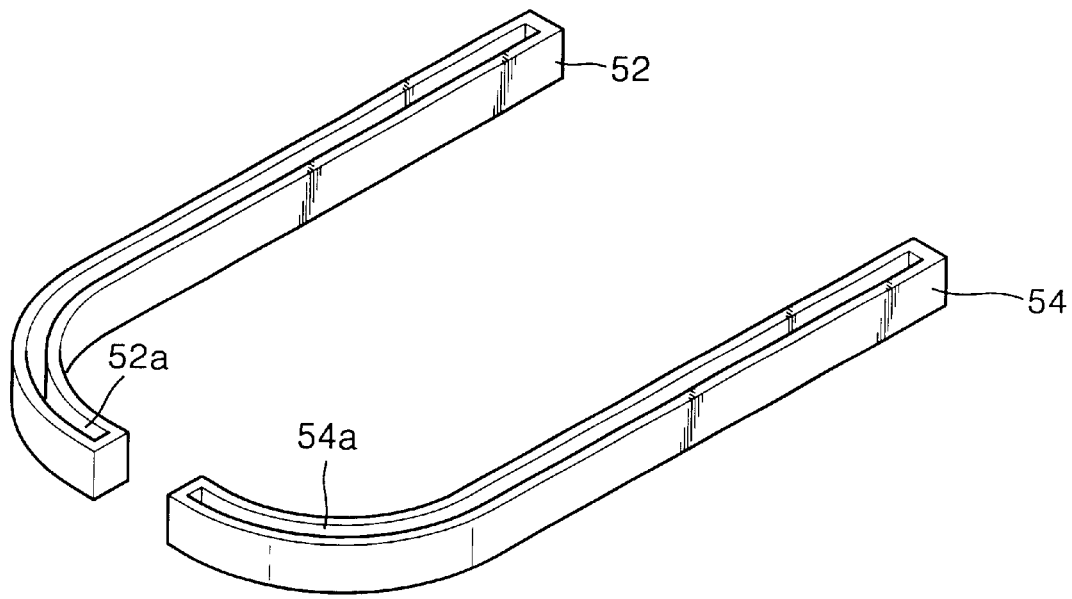
FIG. 10 is a perspective view of adiabatic units separated from a heat transferring device according to the first embodiment of the present invention.

Meanwhile, it is preferable that the adiabatic units 52 and 54 which isolate the evaporator 44 and the gas passage 46 from the liquid refrigerant passage 50 have gaps 52a and 54a, respectively, along their middle portions, as shown in FIG. 10. However, the adiabatic units 52 and 54 may be heat insulating materials which do not have the gaps 52a and 54a. A portion of each of the adiabatic units 52 and 54 surrounding the evaporator 44 is gently curved so that a liquid refrigerant can gently flow into the evaporator 44 along the adiabatic units 52 and 54.

Figure 11:
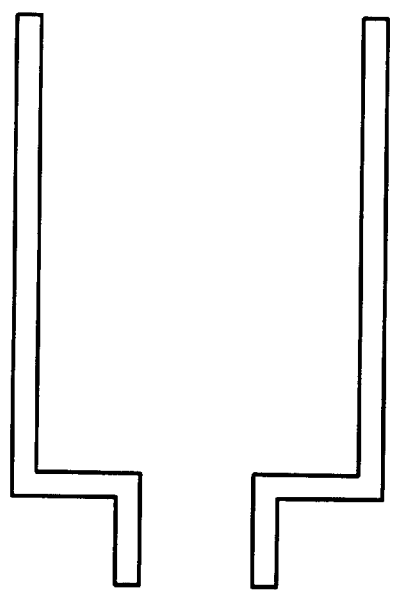
FIGS. 11 and 12 are plan views of the modified examples of the adiabatic units shown in FIG. 10.
Figure 12:
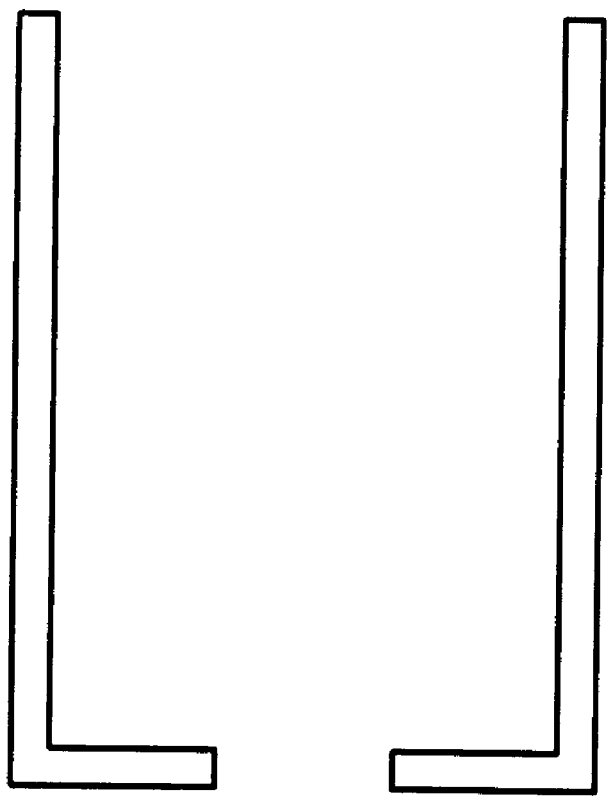

The adiabatic units 52 and 54 can have a different shape than shown in FIG. 10. FIGS. 11 and 12 are plan views of modified examples of the adiabatic units 52 and 54.

FIG. 11 shows adiabatic units having a wider space therebetween at their upper and middle portions than at their lower portion. FIG. 12 shows adiabatic units each having one end portion of a predetermined length bent at a right angle so that the bent end portions of the respective adiabatic units can face each other.

<Second Embodiment>

Figure 13:
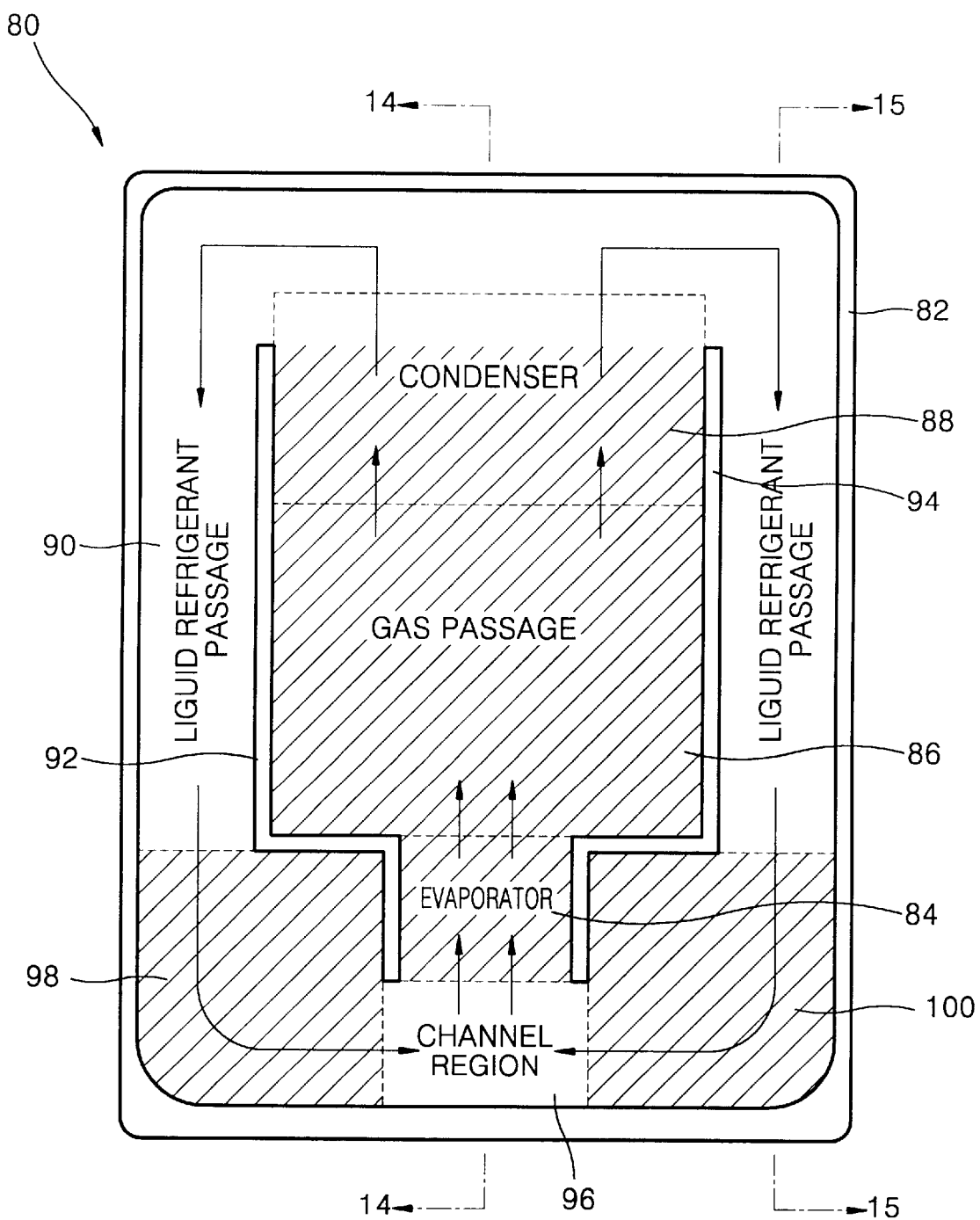
FIG. 13 is a plan view of a lower plate of a heat transferring device according to a second embodiment of the present invention, which has the adiabatic units shown in FIG. 11.

FIG. 13 is a plan view of a lower plate 82 of a heat transferring device according to a second embodiment of the present invention, which has the adiabatic units shown in FIG. 11. Since an upper plate is formed of a transparent glass plate, the plane of the upper plate is not illustrated. In addition, a refrigerant inlet is not illustrated in the second embodiment. Hereinafter, a refrigerant inlet will not be illustrated in all of the following embodiments.

Referring to FIG. 13, a heat transferring device 80 of the second embodiment includes an evaporator 84 and a condenser 88. A gas passage 86 through which gas generated in the evaporator 84 is transferred to the condenser 88 is provided between the condenser 88 and the evaporator 84. In addition, a liquid refrigerant passage 90 is provided between the condenser 88 and the evaporator 84 so that a liquid refrigerant can be supplied from the condenser 88 to the evaporator 84 via the liquid refrigerant passage 90. The gas passage 86 and the liquid refrigerant passage 90 connect the evaporator 84 with the condenser 88 through different paths. First and second adiabatic units 92 and 94 as shown in FIG. 11 are provided between the liquid refrigerant passage 90 and a region composed of the evaporator 84 and the gas passage 86. Portions of the first and second adiabatic units 92 and 94 having a narrow space therebetween isolate the evaporator 84 from the liquid refrigerant passage 90, and portions of the first and second adiabatic units 92 and 94 having a wide space therebetween isolate the gas passage 86 from the liquid refrigerant passage 90. The portions of the first and second adiabatic units 92 and 94 having the wide space therebetween extend to the condenser 88 by a predetermined length. Accordingly, a predetermined region of the condenser 88 bordering the gas passage 86 is isolated from the liquid refrigerant passage 90 by the first and second adiabatic units 92 and 94. The remaining region of the condenser 88 opens to the liquid refrigerant passage 90. The portions of the first and second adiabatic units 92 and 94 having the narrow space therebetween and the portions of the first and second adiabatic units 92 and 94 having the wide space therebetween are connected by connecting portions, respectively, parallel to the border between the gas passage 86 and the evaporator 84. The liquid refrigerant passage 90 between the narrow space between the first and second adiabatic units 92 and 94, that is, the evaporator 84, and the frame of the lower plate 82 close to the evaporator 84 contacts the upper plate (not shown), thereby forming a channel region 96.

In the lower plate 82 of FIG. 13, hatched regions, i.e., the entire region of the evaporator 84 and the gas passage 86, a part of the condenser 88, and predetermined regions 98 and 100 in the liquid refrigerant passage 90 on both sides of the evaporator 84 and the channel region 96, do not contact the upper plate. In the lower plate 82, the remaining region, i.e., the channel region 96, the remaining region of the liquid refrigerant passage 90, and the remaining part of the condenser 88 opening to the liquid refrigerant passage 90, contact the upper plate. Particularly, it is preferable that the frame of the lower plate 82 and the first and second adiabatic units 92 and 94 are hermetically sealed to the upper plate.

Arrows shown in the drawings indicate a direction in which gas or a liquid refrigerant flows. It is preferable to structure patterns on the lower plate 82 in the same manner as in the first embodiment. In other words, it is preferable to structure patterns on the lower plate 82 such that capillary attraction increases from the condenser 88 through the liquid refrigerant passage 90 toward the evaporator 84. Accordingly, patterns formed in the liquid refrigerant passage 90 including the channel region 96, the evaporator 84, and the condenser 88 may have the same shape but preferably have different densities.

Figure 14:
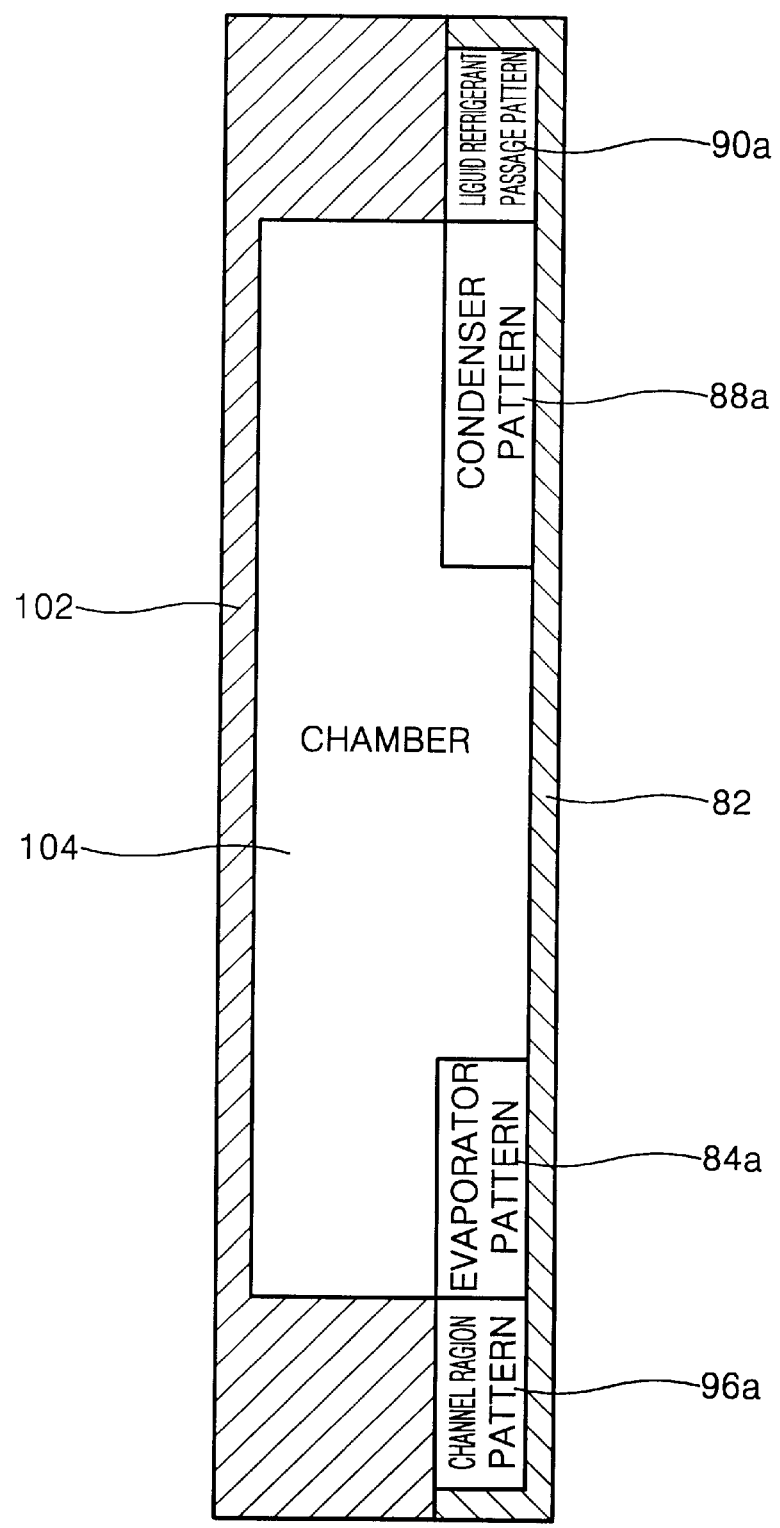
FIG. 14 is a sectional view of the heat transferring device of FIG. 13, taken along the line 14–14'.

FIG. 14 is a sectional view of the heat transferring device 80 taken along the line 14–14' crossing the centers of the channel region 96, the evaporator 84, the gas passage 86, and the condenser 88. Referring to FIGS. 13 and 14, a predetermined pattern 96a (hereinafter, referred to as a channel region pattern 96a) is formed in the channel region 96 to induce capillary attraction for making a liquid refrigerant flowing into the channel region 96 flow into the evaporator 84. A predetermined pattern 84a (hereinafter, referred to as a evaporator pattern 84a) is formed in the evaporator 84 to uniformly supply the liquid refrigerant flowing in through the channel region throughout the evaporator 84. The evaporator pattern 84a is formed to induce greater capillary attraction for the liquid refrigerant than the channel region pattern 96a. Accordingly, the liquid refrigerant spontaneously flows into the evaporator 84 through the channel region 96. The liquid refrigerant flowing into the evaporator 84 absorbs heat radiated from a heating element (not shown) contacting the outside of the evaporator 84 to thus evaporate. A predetermined pattern 88a (hereinafter, referred to as a condenser pattern 88a) is formed in the condenser 88 which is separated from the evaporator 84 by a distance corresponding to the gas passage 86 and condenses gas flowing from the evaporator 84. The condenser pattern 88a has a lowest pattern density among the other patterns formed on the lower plate 82. A predetermined pattern 90a (hereinafter, referred to as a liquid refrigerant passage pattern 90a) formed in the liquid refrigerant passage 90 between the condenser 84 and the close frame of the lower plate 82 induces greater capillary attraction than the condenser pattern 88a so that the liquid refrigerant spontaneously flows from the condenser 84 to the liquid refrigerant passage 80.

An upper plate 102 adhering to the frame of the lower plate 82 contacts the channel region pattern 96a and the liquid refrigerant passage pattern 90a but does not contact the evaporator pattern 84a and the condenser pattern 88a. A chamber 104 covering the evaporator 84, the gas passage 86, and the condenser 88 of the lower plate 82 is provided between a portion of the upper plate 102 contacting the channel region pattern 96a and a portion of the upper plate 102 contacting the liquid refrigerant passage pattern 90a. The chamber 104 is the same as the chamber 62 of FIG. 3 according to the first embodiment. Since the chamber 104 extends over the evaporator pattern 84a and the condenser pattern 88a, it can be used as a passage through which gas generated in the evaporator 84 flows into the condenser 88.

Figure 15:
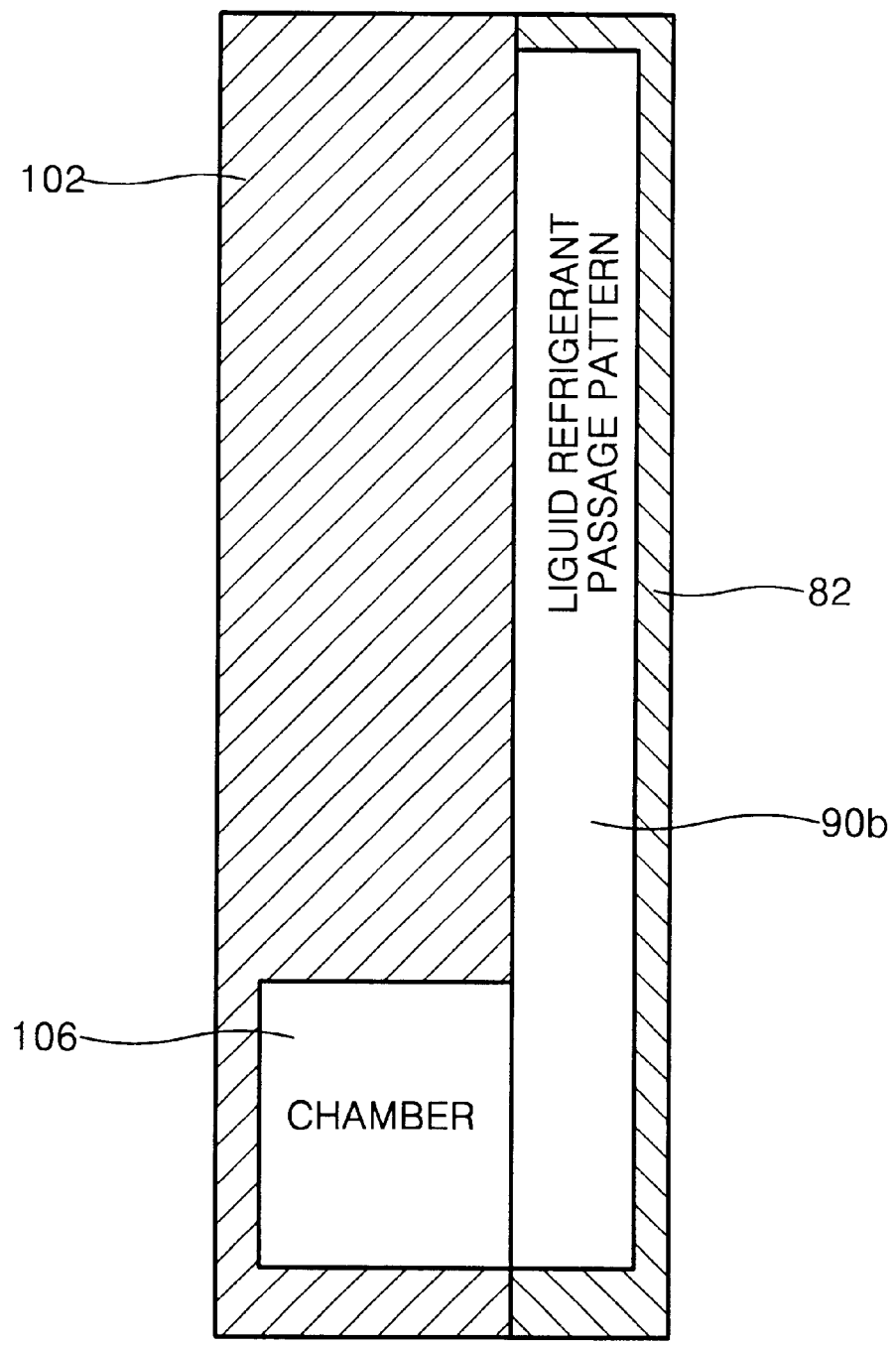
FIG. 15 is a sectional view of the heat transferring device of FIG. 13, taken along the line 15–15'.

Referring to FIG. 13 and FIG. 15 showing a section of the heat transferring device of FIG. 13, taken along the line 15–15', a predetermined pattern 90b (hereinafter, referred to as a liquid refrigerant passage pattern 90b) is formed in the liquid refrigerant passage 90 between the first and second adiabatic units 92 and 94 and the frame of the lower plate 82 close to the first and second adiabatic units 92 and 94. The liquid refrigerant passage pattern 90b except for a lower portion contacts the upper plate 102. A chamber 106 is formed between the upper plate 102 and the portion of the liquid refrigerant passage pattern 90b which does not contact the upper plate 102. The chamber 106 is formed in the same manner and has the same function as the chamber 64 of FIGS. 3 and 4 according to the first embodiment. The chamber 106 corresponds to the hatched region 100 on the right sides of the evaporator 84 and the channel region 96. The liquid refrigerant passage pattern 90b has the same type of pattern density as the liquid refrigerant passage pattern 66 of FIG. 4 according to the first embodiment. In other words, a pattern density in the liquid refrigerant passage pattern 90b gradually increases from an upper portion toward a lower portion in FIG. 15. As a result, capillary attraction gradually increases toward the lower portion. Accordingly, a liquid refrigerant flowing into the liquid refrigerant passage 90 from the condenser 88 continuously flows into the channel region 96. Even if the flow of the liquid refrigerant is stopped for a short moment due to dry-out, since the liquid refrigerant passage 90 has an increasing slope of capillary attraction, as described above, the flow of the liquid refrigerant immediately resumes. In FIG. 13, arrows indicate directions in which a liquid refrigerant or gas flows.

<Third Embodiment>

Figure 16:
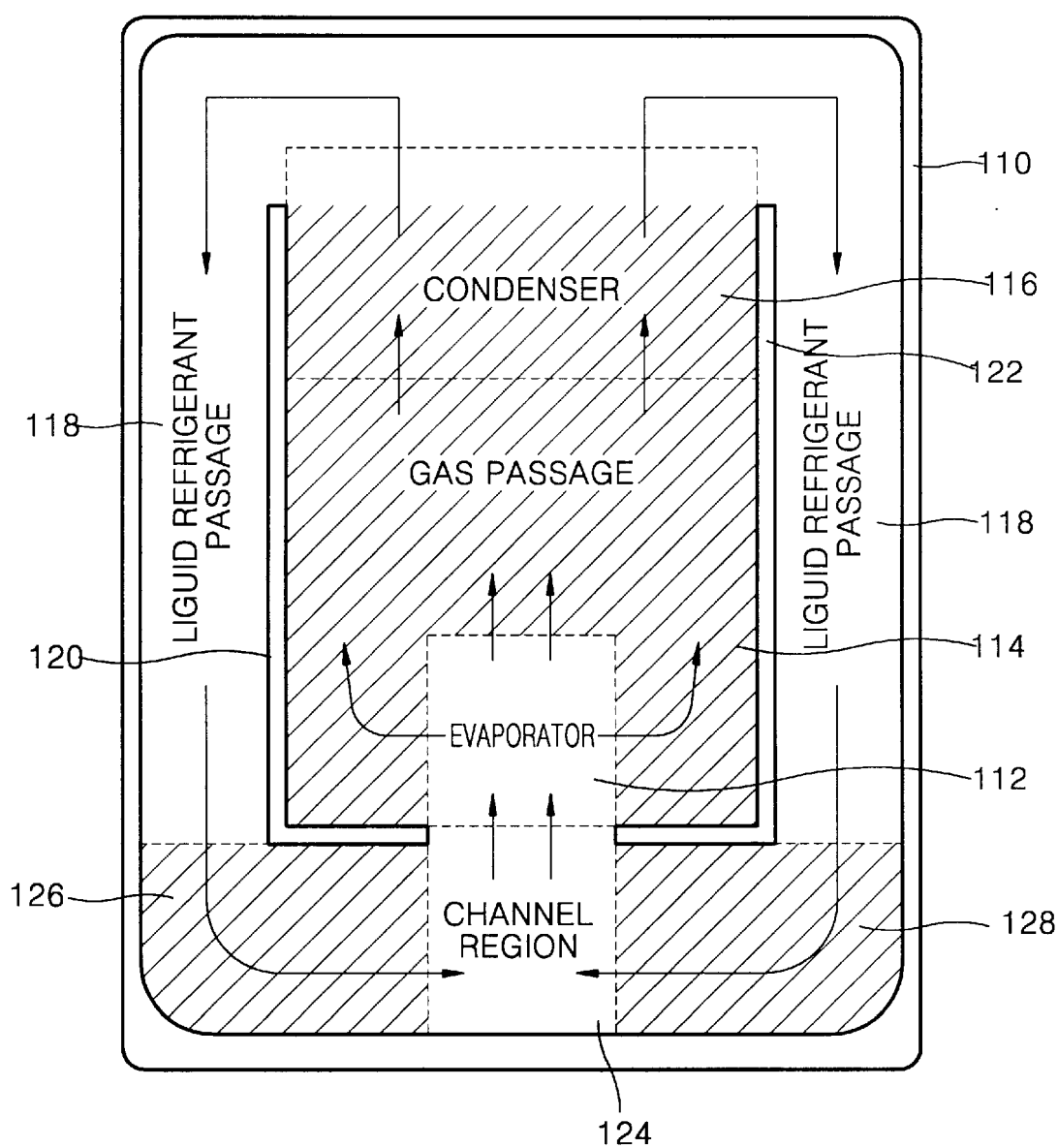
FIG. 16 is a plan view of a lower plate of a heat transferring device according to a third embodiment of the present invention, which has the adiabatic units shown in FIG. 12.

Referring to FIG. 16 showing a heat transferring device having the adiabatic units shown in FIG. 12, first and second adiabatic units 120 and 122 are provided between a liquid refrigerant passage 118 and a gas passage 114 so that they can prevent heat and gas to be transferred from the gas passage 114 to the liquid refrigerant passage 118. The first and second adiabatic units 120 and 122 contact both sides, respectively of a channel region 124. The first and second adiabatic units 120 and 122 extend to predetermined portions of a condenser 116 contacting the gas passage 114. One side of an evaporator 112 into which a liquid refrigerant flows through the channel region 124 contacts the channel region 124, and the other sides of the evaporator 112 are surrounded by the gas passage 114. Like the first and second embodiments, the liquid refrigerant passage 118 is provided between the first and second adiabatic units 120 and 122, the condenser 116, and evaporator 112 and the frame of a lower plate 110 close thereto. A portion of the liquid refrigerant passage 118 between the evaporator 112 and the close frame of the lower plate 110 corresponds to the channel region 124.

In the lower plate 110 of FIG. 16, hatched regions, i.e., the entire region of the evaporator 112 and the gas passage 114, a part of the condenser 116 contacting the gas passage 114, and a region of the liquid refrigerant passage 90 between the channel region 124 and the close frame of the lower plate 110, do not contact an upper plate (not shown). The remaining region including the frame of the lower plate 110, and particularly, the first and second adiabatic units 120 and 122 are contact the upper plate. Consequently, gas generated due to evaporation of a liquid refrigerant can be prevented from flowing into the liquid refrigerant passage 114 from the gas passage 114. Regions on the upper plate corresponding to the hatched regions on the lower plate 110 are recessed to a predetermined depth compared to the remaining regions on the upper plate. Accordingly, chambers (not shown) are formed between the hatched regions on the lower plate 110 and the upper plate. In FIG. 16, arrows indicate directions in which a liquid refrigerant or gas flows.

The functions of the chambers have been described in the above embodiments. Thus, a description thereof will be omitted. For the same reason, descriptions of patterns, which are formed in the condenser 110, the liquid refrigerant passage 118, and the evaporator 112 to make a liquid refrigerant spontaneously flow from the condenser 110 through the liquid refrigerant passage 118 into the evaporator 112, will be omitted.

Subsequently, heat transferring devices according to fourth through sixth embodiments will be described. Unlike the heat transferring devices according to first through third embodiments having two symmetric adiabatic units, the heat transferring devices according to the fourth through sixth embodiments have one adiabatic unit or two asymmetric adiabatic units.

The following descriptions of the heat transferring devices according to the present invention will be restricted to the disposition and shape(s) of an adiabatic unit or adiabatic units, portions of a lower plate contacting an upper plate, and portions of the lower plate not contacting the upper plate. The shapes and disposition of patterns formed in a condenser, a liquid refrigerant passage whose part is used as a channel region, and an evaporator are set such that capillary attraction gradually increases from the condenser through the liquid refrigerant passage toward the evaporator to make a liquid refrigerant spontaneously flow into the evaporator. These have been fully described in the above embodiments. Thus, descriptions thereof will be omitted.

<Fourth Embodiment>

Figure 17:
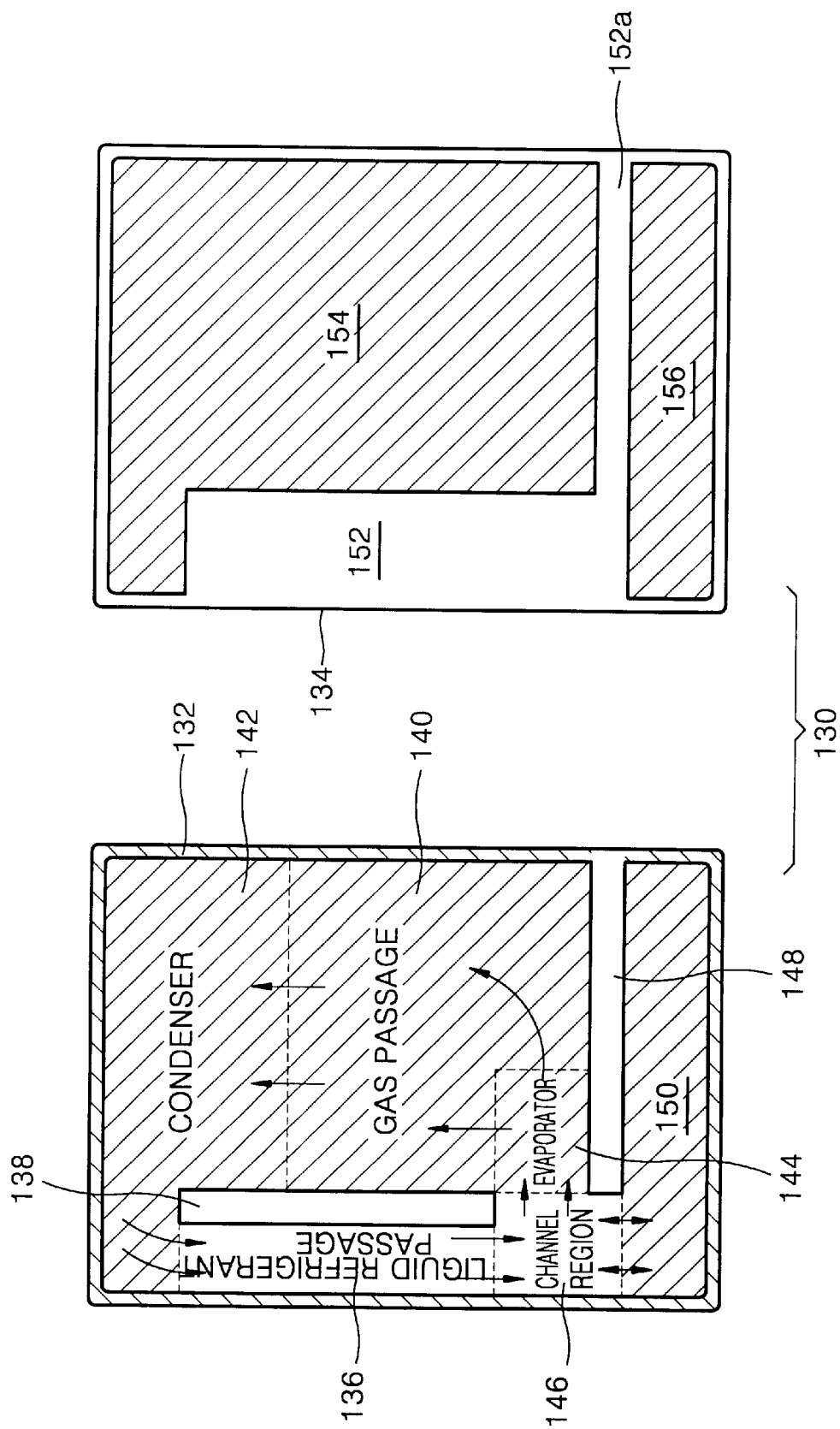
FIG. 17 is a plan view of a heat transferring device according to a fourth embodiment of the present invention.

FIG. 17 separately illustrates a lower plate 132 and an upper plate 134 constituting a heat transferring device 130 according to the fourth embodiment. In FIG. 17, not the inside of the upper plate 134 contacting the lower plate 132 but the top of the upper plate 134 which does not contact the lower plate 132 is illustrated.

Referring to FIG. 17, the lower plate 132 is composed of an evaporator 144, a gas passage 140 bordering two adjacent sides of the evaporator 144, a condenser 142 bordering the gas passage 140, and a liquid refrigerant passage 136. The liquid refrigerant passage 136 borders a part of the condenser 142, is isolated from the gas passage 140, and has a region, which borders one of two sides of the evaporator 144 not bordering the gas passage 140, as a channel region 146. The liquid refrigerant passage 136 is relatively narrower than the gas passage 140. First and second adiabatic units 138 and 148 are provided between the liquid refrigerant passage 136 and the gas passage 140. The first and second adiabatic units 138 and 148 are formed to be parallel to their facing sides of the frame of the lower plate 132. The first adiabatic unit 138 extends starting from the start point of the channel region 146 in the liquid refrigerant passage 136 toward the condenser 142 so that a portion of the first adiabatic unit 138 is disposed between the liquid refrigerant passage 136 and the condenser 142. In other words, a part of the condenser 142 is isolated from the liquid refrigerant passage 136 by the first adiabatic unit 138. A part of the condenser 142 extends beyond the first adiabatic unit 138, borders a part of the frame of the lower plate 132 which dose not border the liquid refrigerant passage 136, and borders the liquid refrigerant passage 136. The liquid refrigerant passage 136 is composed of the channel region 146 and two separate regions around the channel region 146. One of the two separate regions is between the first adiabatic unit 138 and the frame of the lower plate 132 close to the first adiabatic unit 138, and the other region 150 is close to the evaporator 144 and gas passage 140. The region 150 is isolated from the evaporator 144 and the gas passage 140 by the second adiabatic unit 148. The second adiabatic unit 148 extends starting from a side of the channel region 146 bordering the evaporator 144 in a direction opposite to the channel region 146 and perpendicular to the first adiabatic unit 138. The second adiabatic unit 148 borders the other side of the two sides of the evaporator 144 which do not border the gas passage 140.

The lower plate 132 contacts the upper plate 134 except hatched regions, i.e., the entire evaporator 144, the entire gas passage 140, the entire condenser 142, and the region 150 of the liquid refrigerant passage 136 close to the evaporator 144 and the gas passage 140. Hatched regions 154 and 156 of the upper plate 134 corresponding to the hatched regions of the lower plate 132 are recessed to a predetermined depth compared to the other regions of the upper plate 134. A chamber formed between the region 156 corresponding to the region 150 of the liquid refrigerant passage 136 close to the evaporator 144 and the gas passage 140 and a pattern (not shown) formed in the region 150 is used for storing a surplus liquid refrigerant and collecting bubbles or uncondensed gas contained in a liquid refrigerant flowing into the liquid refrigerant passage 136. Reference numeral 152 denotes a portion of the upper plate 134 contacting the first adiabatic unit 138, a region of the liquid refrigerant passage 136 between the first adiabatic unit 138 and the close frame of the lower plate 132, and the channel region 146. Reference numeral 152a denotes a portion of the upper plate 134 contacting the second adiabatic unit 148.

<Fifth Embodiment>

Figure 18:
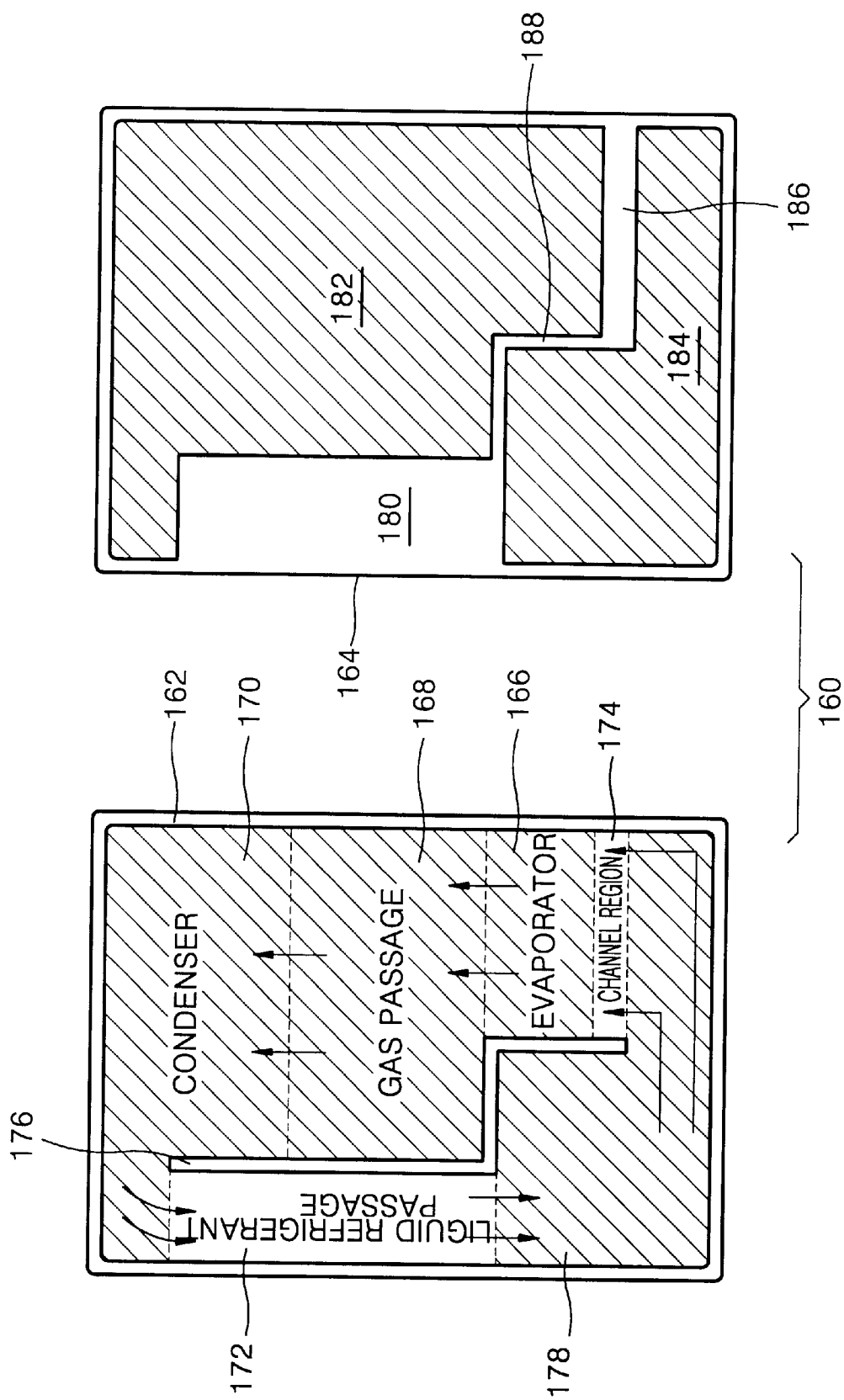
FIG. 18 is a plan view of a heat transferring device according to a fifth embodiment of the present invention.

Referring to FIG. 18, a heat transferring device 160 according to the fifth embodiment includes an adiabatic unit 176 which is formed on a lower plate 162 to be parallel to one side of the frame of the lower plate 162. The adiabatic unit 176 has a bended part. It is preferable that the bended part is at right angles with the other portion of the adiabatic unit 176 parallel to the one side of the frame of the lower plate 162, but the bended part may just slant. Both ends of the adiabatic unit 176 are separated from the frame of the lower plate 162 by a predetermined distance. For clarity, the adiabatic unit 176 is divided into an upper portion and a lower portion on the basis of the bended part. The upper portion of the adiabatic unit 176 is longer than the lower portion. The upper portion of the adiabatic unit 176 is nearer to the frame of the lower plate 162 than the lower portion. However, the portion of the adiabatic unit 176 may be far from the lower plate 162 than the lower portion.

A liquid refrigerant passage 172 is formed between the adiabatic unit 176 and the frame of the lower plate 162 close to the adiabatic unit 176. the liquid refrigerant passage 172 is connected to a condenser 170. A liquid refrigerant flows into a channel region 174 through the liquid refrigerant passage 172. The channel region 174, the evaporator 166, a gas passage 168, and the condenser 170 are sequentially provided from the bottom of a region between the adiabatic unit 176 and another side of the frame of the lower plate 162 which is parallel to but not close to the adiabatic unit 176. The channel region and the evaporator 166 are provided between the lower portion of the adiabatic unit 176 and the side of the frame of the lower plate 162 which is parallel to but not close to the adiabatic unit 176. The gas passage 168 and the condenser 170 are provided between the upper portion of the adiabatic unit 176 and the side of the frame of the lower plate 162 which is parallel to but not close to the adiabatic unit 176. A part of the condenser 170 extends beyond the adiabatic unit 176 to border the liquid refrigerant passage 172. A portion 178 of the liquid refrigerant passage 172 between the lower portion of the adiabatic unit 176 and the side of the frame of the lower plate 162 parallel and close to the adiabatic unit 176 extends beyond the lower portion of the adiabatic unit 176 to border the channel region 174.

Hatched regions 166, 168, 170, and 178 on the lower plate 162 do not contact an upper plate 164. Regions 182 and 184 on the upper plate 164 corresponding to the hatched regions 166, 168, 170, and 170 are recessed to a predetermined depth so that chambers are formed between micro patterns (not shown), which are formed in the hatched regions 166, 168, 170, and 170 on the lower plate 162, and the regions 182 and 184 on the upper plate 164. Reference numeral 180 denotes a portion of the upper plate 164 contacting the liquid refrigerant passage 172 between the upper portion of the adiabatic unit 176 and the close and parallel side of the frame of the lower plate 162 and contacting the upper portion of the adiabatic unit 176. Reference numeral 188 denotes a portion of the upper plate 164 contacting the bend and the lower portion of the adiabatic unit 176. Reference numeral 186 denotes a portion of the upper plate 164 contacting the channel region 174.

<Sixth Embodiment>

Figure 19:
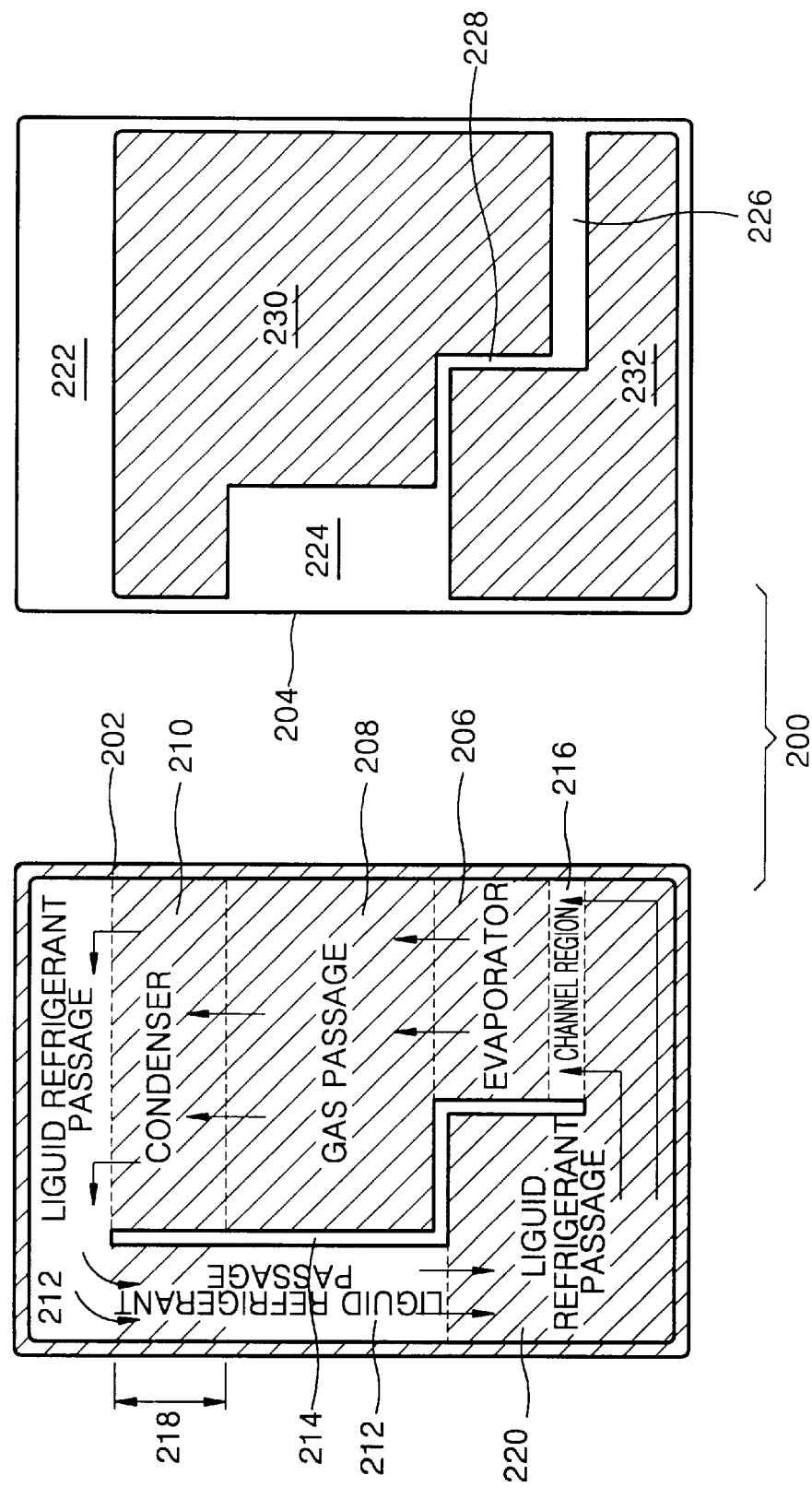
FIG. 19 is a plan view of a heat transferring device according to a sixth embodiment of the present invention.

Referring to FIG. 19, a lower plate 202 of a heat transferring device 200 includes an adiabatic unit 214. A liquid refrigerant passage 212 is provided between the adiabatic unit 214 and the frame of the lower plate 202 close to the adiabatic unit 214. A channel region 216 which is a part of the liquid refrigerant passage 212, an evaporator 206, a gas passage 208, and a condenser 210 are provided between the adiabatic unit 214 and one side of the frame of the lower plate 202 which is parallel to but not close to the adiabatic unit 214. The liquid refrigerant passage 212 extends between the condenser 210 and the frame of the lower plate 202 facing and close to the condenser 210. The adiabatic unit 214, the channel region 216, the evaporator 206, and the gas passage 208 are the same as those on the lower plate 162 of the heat transferring device 160 according to the fifth embodiment. The condenser 210 and the liquid refrigerant passage 212 are almost the same as those in the fifth embodiment with the exception that the condenser 210 does not go beyond the upper end of the adiabatic unit 214 and the liquid refrigerant passage 212 extends beyond the upper end of the adiabatic unit 214 to a region between the condenser 210 and the frame of the lower plate 202 facing and close to the condenser 210. The liquid refrigerant passage 212 extends beyond the lower end of the adiabatic unit 214 to a region between the channel region 216 and the frame of the lower plate 202 adjacent to the channel region 216. As a whole, the liquid refrigerant passage 212 roughly forms a shape "⊏" surrounding the three sides of a region other than the liquid refrigerant passage 212 in the lower plate 202.

The frame of the lower plate 202, the channel region 216, the portion of the adiabatic unit 214 other than a portion between the condenser 210 and the liquid refrigerant passage 212, and a part of the liquid refrigerant passage 212 contact the upper plate 204. The remaining region of the lower plate 202 does not contact the upper plate 204. Hatched regions of the lower plate 202 correspond to the regions not contacting the upper plate 204. Hatched regions 230 and 232 of the upper plate 204 are recessed to a predetermined depth and correspond to the hatched regions of the lower plate 202. Only a portion of the liquid refrigerant passage 212 adjacent to the gas passage 208 contacts the upper plate 204. The portion of the liquid refrigerant passage 212 isolated from the condenser 210 by the adiabatic unit 214 and a region 220 extending from a portion between the lower portion of the adiabatic unit 214 and a side of the frame of the lower plate 202 close to the lower portion of the adiabatic unit 214 to a portion between the channel region 216 and a side of the frame of the lower plate 202 close to the channel region 216 do not contact the upper plate 204.

Reference numeral 222 denotes a region of the upper plate 204 contacting the liquid refrigerant passage 212 extending beyond the upper end of the adiabatic unit 214 to the region between the condenser 210 and the frame of the lower plate 202 facing and close to the condenser 210. Reference numeral 224 denotes a region of the upper plate 204 contacting the liquid refrigerant passage 212 neighboring the gas passage 208. Reference numeral 228 denotes a region of the upper plate 204 contacting the bend of the adiabatic unit 214 and a part of the lower portion of the adiabatic unit 214. Reference numeral 226 denotes a region of the upper plate 204 contacting a portion of the adiabatic unit 214 connected to the channel region 216 and the channel region 216.

As described above, a heat transferring device according to the present invention includes an adiabatic unit between a gas passage and a liquid refrigerant passage to prevent gas from flowing from the gas passage into the liquid refrigerant passage and to prevent heat from being transferred from the gas passage into the liquid refrigerant passage. Accordingly, a liquid refrigerant is prevented from evaporating while it is flowing from a condenser to an evaporator. In addition, a chamber for collecting bubbles or uncondensed gas contained in the liquid refrigerant is provided between a part of the liquid refrigerant passage and an upper plate, thereby preventing the flow of the liquid refrigerant from being stopped due to bubbles or uncondensed gas. Moreover, since micro patterns are formed in the condenser, the liquid refrigerant passage including a channel region, and the evaporator such that capillary attraction for the liquid refrigerant gradually increases toward the evaporator, the liquid refrigerant spontaneously flows from the condenser through the liquid refrigerant passage into the evaporator. Even if the flow of the liquid refrigerant is stopped for a short moment due to, for example, dry-out, the flow of the liquid refrigerant spontaneously resumes due to the slope of capillary attraction among the condenser, the liquid refrigerant passage, and the evaporator. The slope of capillary attraction allows the liquid refrigerant to flow into the evaporator before the operation of a heat transferring device so that the heat transferring device can operate reliably.

While this invention has been particularly shown and described with reference to preferred embodiments thereof, the preferred embodiments are used in descriptive sense only. For example, it will be understood by those skilled in the art that micro patterns inducing capillary attraction can be formed in corresponding regions on the inner side of an upper plate instead of a lower plate. An adiabatic unit can be provided at a corresponding position on the upper plate instead of the lower plate. A gas passage can be provided with thin films which connect an evaporator to a condenser and divide the gas passage into a plurality of passages. An adiabatic unit isolating a liquid refrigerant passage from at least the gas passage can be formed in various shapes symmetrically or asymmetrically. Instead of micro patterns, a porous medium having pores whose size gradually decreases can be provided in a channel region. In addition, a predetermined cooling device including a heat absorption unit which can take heat from the condenser can be provided in the present invention. Therefore, the scope of the invention will be defined not by the above-described embodiments but by the spirit of the appended claims.

What is claimed is:

1. A heat transferring device comprising:
   a lower plate comprising an evaporator which contacts a heating element and allows a liquid refrigerant to absorb heat transferred from the heating element to thus evaporate, a condenser in which gas flowing from the evaporator is condensed, a gas passage through which the gas flowing from the evaporator into condenser, a liquid refrigerant passage through which the liquid refrigerant flows from the condenser into the evaporator and which comprises a portion used as a channel region bordering the evaporator, and adiabatic means provided between the liquid refrigerant passage and the gas passage so that elements hindering the flow of the liquid refrigerant can be prevented from being introduced from the gas passage into the liquid refrigerant passage; and
   an upper plate which contacts some members of the lower plate including the adiabatic means.

2. The heat transferring device of claim 1, wherein the adiabatic means is in contact with the channel region.

3. The heat transferring device of claim 1, wherein one side of the evaporator is in contact with the channel region, and the other sides of the evaporator is in contact with the gas passage.

4. The heat transferring device of claim 1, wherein the adiabatic means extends between the evaporator and the liquid refrigerant passage and is in contact with the channel region.

5. The heat transferring device of claim 1, wherein the adiabatic means extends between the condenser and the liquid refrigerant passage.

6. The heat transferring device of claim 5, wherein the liquid refrigerant passage extends between the condenser and the frame of the lower plate adjacent to the condenser.

7. The heat transferring device of claim 6, wherein the adiabatic means comprises first adiabatic means and second adiabatic means which are symmetric.

8. The heat transferring device of claim 6, wherein the adiabatic means is single means parallel to the frame of the lower plate and comprises a bended part.

9. The heat transferring device of claim 8, wherein the width of the liquid refrigerant passage provided between the adiabatic means and the frame of the lower plate adjacent to the adiabatic means changes on the basis of the bended part of the adiabatic means.

10. The heat transferring device of claim 9, wherein the channel region and the evaporator are sequentially provided between a portion of the adiabatic means below the bend and the frame of the lower plate which is parallel to but does not adjacent to the adiabatic means.

11. The heat transferring device of claim 10, wherein the liquid refrigerant passage extends between the channel region and the frame of the lower plate adjacent to the channel region and is in contact with the channel region.

12. The heat transferring device of claim 11, wherein the liquid refrigerant passage neighboring the condenser does not contact the upper plate.

13. The heat transferring device of claim 12, wherein a portion of the liquid refrigerant passage between the portion of the adiabatic means below the bended part and the frame of the lower plate adjacent to the portion below the bend and a portion extending from the portion therebetween in the liquid refrigerant passage do not contact the upper plate.

14. The heat transferring device of claim 13, wherein a portion of the adiabatic means isolating the condenser from the neighboring liquid refrigerant passage does not contact the upper plate.

15. The heat transferring device of claim 14, wherein micro patterns are formed in the condenser, the liquid refrigerant passage, the channel region, and the evaporator such that capillary attraction for the liquid refrigerant gradually increases from the condenser toward the evaporator sequentially through the liquid refrigerant passage and the channel region.

16. The heat transferring device of claim 14, wherein a chamber is provided between the upper plate and the micro patterns formed in the liquid refrigerant passage which does not contact the upper plate by removing the inner side of the upper plate to a predetermined depth.

17. The heat transferring device of claim 16, wherein regions of the upper plate corresponding to the evaporator, the gas passage, and the condenser are recessed a predetermined depth.

18. The heat transferring device of claim 7, wherein the channel region is provided between the evaporator and the frame of the lower plate adjacent to the evaporator.

19. The heat transferring device of claim 18, wherein a part of the liquid refrigerant passage does not contact the upper plate.

20. The heat transferring device of claim 19, wherein micro patterns are formed in the condenser, the liquid refrigerant passage, the channel region, and the evaporator such that capillary attraction for the liquid refrigerant gradually increases from the condenser toward the evaporator sequentially through the liquid refrigerant passage and the channel region.

21. The heat transferring device of claim 20, wherein a chamber is provided between the upper plate and the micro patterns formed in the liquid refrigerant passage which does not contact the upper plate on both sides of the channel region, by removing the inner side of the upper plate to a predetermined depth.

22. The heat transferring device of claim 21, wherein regions of the upper plate corresponding to the evaporator, the gas passage, and the condenser are recessed a predetermined depth.

23. The heat transferring device of claim 5, wherein the condenser extends beyond the upper end of the adiabatic means and borders the liquid refrigerant passage provided between the adiabatic means and the frame of the lower plate adjacent to and the adiabatic means.

24. The heat transferring device of claim 23, wherein the adiabatic means is parallel to the adjacent frame of the lower plate and comprises a bend.

25. The heat transferring device of claim 24, wherein a part of the liquid refrigerant passage does not contact the upper plate.

26. The heat transferring device of claim 25, wherein micro patterns are formed in the condenser, the liquid refrigerant passage, the channel region, and the evaporator such that capillary attraction for the liquid refrigerant gradually increases from the condenser toward the evaporator sequentially through the liquid refrigerant passage and the channel region.

27. The heat transferring device of claim 26, wherein a chamber is provided between the upper plate and the micro patterns formed in the liquid refrigerant passage which does not contact the upper plate by removing the inner side of the upper plate to a predetermined depth.

28. The heat transferring device of claim 23, wherein the liquid refrigerant passage is divided into first and second regions by the channel region.

29. The heat transferring device of claim 28, wherein the adiabatic means comprises:
first adiabatic means which isolates the gas passage from the first region of the liquid refrigerant passage provided between the condenser and the channel region; and
second adiabatic means which is formed to be perpendicular to the first adiabatic means and isolates the evaporator and the gas passage from the remaining second region of the liquid refrigerant passage.

30. The heat transferring device of claim 29, wherein the second region of the liquid refrigerant passage does not contact the upper plate.

31. The heat transferring device of claim 30, wherein micro patterns are formed in the condenser, the liquid refrigerant passage, the channel region, and the evaporator such that capillary attraction for the liquid refrigerant gradually increases from the condenser toward the evaporator sequentially through the liquid refrigerant passage and the channel region.

32. The heat transferring device of claim 31, wherein a chamber is provided between the upper plate and the micro patterns formed in the liquid refrigerant passage which does not contact the upper plate by removing the inner side of the upper plate to a predetermined depth.

33. The heat transferring device of claim 7, wherein each of the first and second adiabatic means is a structure comprising a gap.

34. The heat transferring device of claim 29, wherein each of the first and second adiabatic means is a structure comprising a gap.

35. The heat transferring device of claim 7, wherein each of the first and second adiabatic means is a barrier formed of an insulating material.

36. The heat transferring device of claim 29, wherein each of the first and second adiabatic means is a barrier formed of an insulating material.

37. The heat transferring device of claim 7, wherein one of the first and second adiabatic means is a structure comprising a gap and the other is a barrier formed of an insulating material.

38. The heat transferring device of claim 29, wherein one of the first and second adiabatic means is a structure comprising a gap and the other is a barrier formed of an insulating material.

39. The heat transferring device of claim 8, wherein the adiabatic means is a structure comprising a gap.

40. The heat transferring device of claim 24, wherein the adiabatic means is a structure comprising a gap.

41. The heat transferring device of claim 8, wherein the adiabatic means is a barrier formed of an insulating material.

42. The heat transferring device of claim 24, wherein the adiabatic means is a barrier formed of an insulating material.

* * * * *